US010128155B2

(12) United States Patent
Jeong et al.

(10) Patent No.: US 10,128,155 B2
(45) Date of Patent: Nov. 13, 2018

(54) INTEGRATED CIRCUIT DEVICE AND METHOD OF FABRICATING THE SAME

(71) Applicant: SAMSUNG ELECTRONICS CO., LTD., Suwon-si, Gyeonggi-do (KR)

(72) Inventors: Yongkuk Jeong, Yongin-si (KR); Gi-Gwan Park, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/831,480

(22) Filed: Dec. 5, 2017

(65) Prior Publication Data
US 2018/0102293 A1 Apr. 12, 2018

Related U.S. Application Data

(63) Continuation of application No. 15/356,821, filed on Nov. 21, 2016, now Pat. No. 9,875,938.

(30) Foreign Application Priority Data

Jun. 20, 2016 (KR) .................. 10-2016-0076615

(51) Int. Cl.
*H01L 27/11* (2006.01)
*H01L 21/8234* (2006.01)
(Continued)

(52) U.S. Cl.
CPC ........... *H01L 21/823431* (2013.01); *H01L 21/31111* (2013.01); *H01L 21/31116* (2013.01);
(Continued)

(58) Field of Classification Search
CPC ......... H01L 29/66795; H01L 29/66545; H01L 29/0847; H01L 29/6656; H01L 29/785;
(Continued)

(56) References Cited

U.S. PATENT DOCUMENTS

| 7,634,669 B2 | 5/2009 | Anderson et al. |
| 7,554,165 B2 | 6/2009 | Hokazono |

(Continued)

FOREIGN PATENT DOCUMENTS

JP    2008-277416    11/2008

OTHER PUBLICATIONS

Co-Pending U.S. Appl. No. 15/356,821, filed Nov. 21, 2016.

*Primary Examiner* — Jaehwan Oh
(74) *Attorney, Agent, or Firm* — F. Chau & Associates, LLC

(57) ABSTRACT

An integrated circuit device includes: a first fin-type active region in a first area of a substrate, the first fin-type active region having a first recess filled with a first source/drain region; a first device isolation layer covering both lower sidewalls of the first fin-type active region; a second fin-type active region in a second area of the substrate, the second fin-type active region having a second recess filled with a second source/drain region; a second device isolation layer covering both lower sidewalls of the second fin-type active region; and a fin insulating spacer on the first device isolation layer, the fin insulating spacer covering a sidewall of the first fin-type active region under the first source/drain region.

20 Claims, 33 Drawing Sheets

(51) Int. Cl.
*H01L 21/311* (2006.01)
*H01L 27/088* (2006.01)
*H01L 21/8238* (2006.01)
*H01L 29/78* (2006.01)
*H01L 27/092* (2006.01)

(52) U.S. Cl.
CPC ........... *H01L 21/823418* (2013.01); *H01L 21/823481* (2013.01); *H01L 21/823814* (2013.01); *H01L 21/823821* (2013.01); *H01L 21/823878* (2013.01); *H01L 27/0886* (2013.01); *H01L 27/0924* (2013.01); *H01L 27/1104* (2013.01); *H01L 29/785* (2013.01)

(58) Field of Classification Search
CPC ......... H01L 21/823821; H01L 27/0886; H01L 29/165; H01L 29/66636; H01L 29/7848; H01L 29/7851
See application file for complete search history.

(56) References Cited

U.S. PATENT DOCUMENTS

| | | | |
|---|---|---|---|
| 7,723,805 | B2 | 5/2010 | Orlowski et al. |
| 8,716,797 | B2 | 5/2014 | Basker et al. |
| 8,932,918 | B2 | 1/2015 | Cheng et al. |
| 9,159,812 | B1 | 10/2015 | Hsiao et al. |
| 9,231,051 | B2 | 1/2016 | Cai et al. |
| 9,384,964 | B1* | 7/2016 | Jeong ............... H01L 21/02318 |
| 9,570,567 | B1* | 2/2017 | Chang ............... H01L 29/785 |
| 2013/0264617 | A1 | 10/2013 | Joshi et al. |
| 2015/0249142 | A1 | 9/2015 | Chen et al. |
| 2015/0303284 | A1 | 10/2015 | Basker et al. |
| 2016/0005866 | A1* | 1/2016 | Wu .................... H01L 29/7851 257/401 |
| 2016/0254365 | A1* | 9/2016 | Tsai .................. H01L 29/66795 257/401 |
| 2016/0315172 | A1* | 10/2016 | Wu .................... H01L 29/0847 |
| 2016/0336450 | A1* | 11/2016 | Tak ................... H01L 29/7851 |

\* cited by examiner

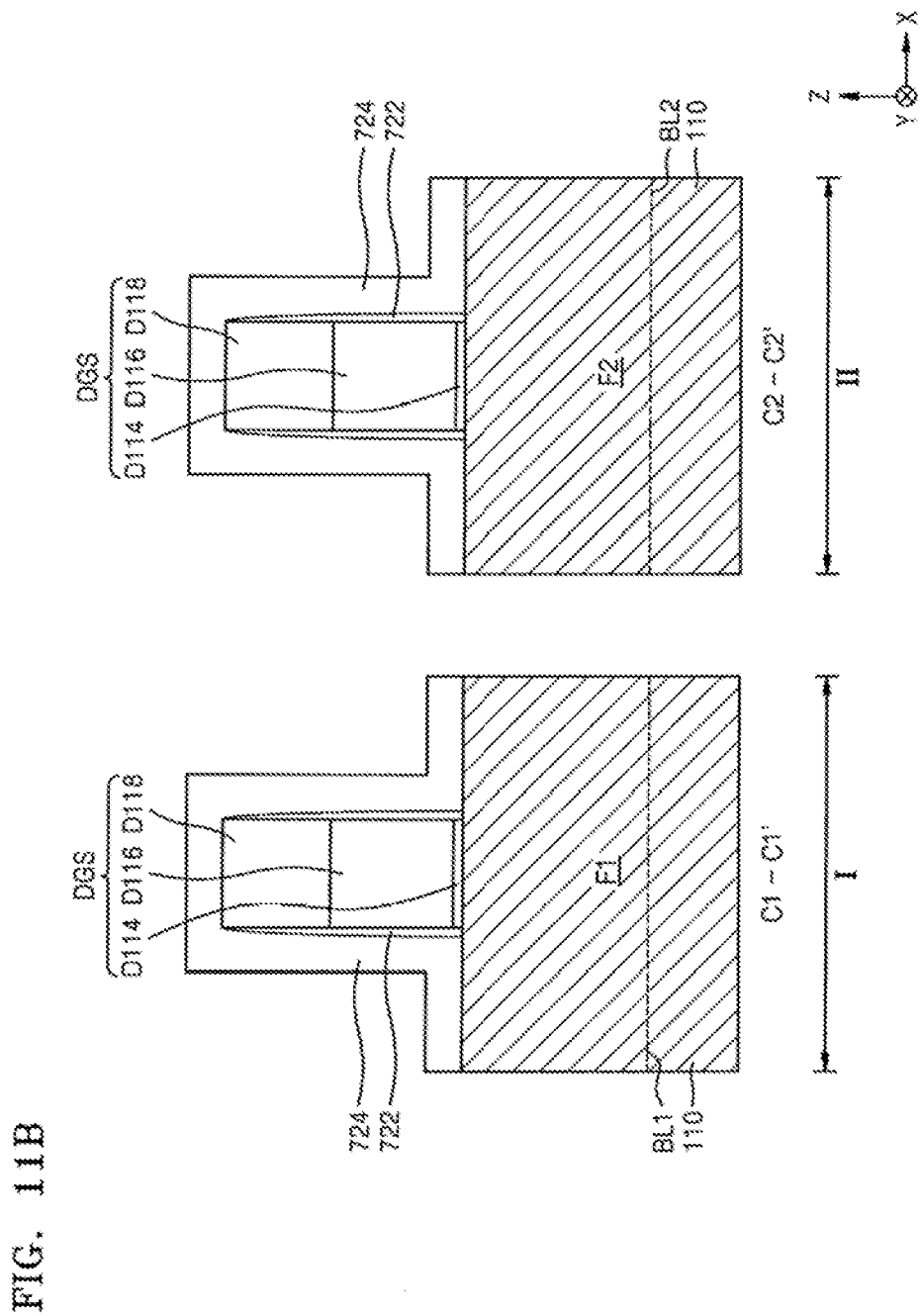

INTEGRATED CIRCUIT DEVICE AND METHOD OF FABRICATING THE SAME

CROSS-REFERENCE TO RELATED APPLICATION

This application is a continuation of U.S. application Ser. No. 15/356,821 filed on Nov. 21, 2016, which claims priority under 35 U.S.C. § 119 of Korean Patent Application No. 10-2016-0076615, filed on Jun. 20, 2016, in the Korean Intellectual Property Office, the disclosure of which is incorporated by reference herein in its entirety.

TECHNICAL FIELD

The inventive concept relates to an integrated circuit device and a method of fabricating the same, and more particularly, to an integrated circuit device including a field effect transistor, and a method of fabricating the same.

DISCUSSION OF RELATED ART

Recently, due to the rapid development of the electronic technology, down-scaling of semiconductor devices has been continuously performed at a fast speed. However, due to the miniaturization of the semiconductor devices, various defects, such as short circuits, may occur in the dense and/or irregular structure areas of the devices, and the resulting defects may degrade the reliability of the semiconductor devices and may reduce their operation accuracy. Since semiconductor devices require fast operation speeds as well as operation accuracy, various studies for optimizing structures of transistors included in the semiconductor devices are being carried out.

SUMMARY

The inventive concept provides an integrated circuit device having a structure enabling unit devices in the integrated circuit device to secure different electrical properties that are required depending upon the kinds and structures of the unit devices, thereby enhancing the reliability of the integrated circuit device. The inventive concept also provides a method of fabricating the integrated circuit device, and the method may include a low-cost simplified process.

According to an aspect of the inventive concept, there is provided an integrated circuit device including: a substrate having a first area and a second area; a first fin-type active region in the first area, the first fin-type active region including a first fin portion having a first recess filled with a first source/drain region; a first device isolation layer covering both lower sidewalls of the first fin-type active region; a second fin-type active region in the second area, the second fin-type active region including a second fin portion having a second recess filled with a second source/drain region; a second device isolation layer covering both lower sidewalls of the second fin-type active region; and a fin insulating spacer covering at least one of a first sidewall of the first fin-type active region and a second sidewall of the second fin-type active region, the first sidewall of the first fin-type active region being between the first device isolation layer and the first recess, and the second sidewall of the second fin-type active region being between the second device isolation layer and the second recess.

According to another aspect of the inventive concept, there is provided an integrated circuit device including: a first fin-type active region in a first area of a substrate, the first fin-type active region protruding from the substrate and having a first channel region and a first recess; a first device isolation layer in the first area, the first device isolation layer covering both lower sidewalls of the first fin-type active region; a first gate line on the first device isolation layer, the first gate line covering the first channel region; a first source/drain region in the first recess; a second fin-type active region in a second area of the substrate, the second fin-type active region protruding from the substrate and having a second channel region and a second recess, the second area of the substrate being spaced apart from the first area of the substrate; a second device isolation layer in the second area, the second device isolation layer covering both lower sidewalls of the second fin-type active region; a second gate line on the second device isolation layer, the second gate line covering the second channel region; a second source/drain region in the second recess; a fin insulating spacer only in the first area out of the first area and the second area, the fin insulating spacer covering both sidewalls of the first fin-type active region between the first device isolation layer and the first source/drain region.

According to a further aspect of the inventive concept, there is provided an integrated circuit device including: a first fin-type active region in a first area of a substrate, the first fin-type active region protruding from the substrate and having a first channel region and a first recess; a first device isolation layer in the first area, the first device isolation layer covering both lower sidewalls of the first fin-type active region; a first gate line on the first device isolation layer, the first gate line covering the first channel region; a first source/drain region in the first recess; a second fin-type active region in a second area of the substrate, the second fin-type active region protruding from the substrate and having a second recess and a second channel region, the second area of the substrate being spaced apart from the first area of the substrate; a second device isolation layer in the second area, the second device isolation layer covering both lower sidewalls of the second fin-type active region; a second gate line on the second device isolation layer, the second gate line covering the second channel region; a second source/drain region in the second recess; a first fin insulating spacer covering a sidewall of the first fin-type active region between the first device isolation layer and the first source/drain region, and having a first height; and a second fin insulating spacer covering a sidewall of the second fin-type active region between the second device isolation layer and the second source/drain region, and having a second height that is smaller than the first height.

According to yet another aspect of the inventive concept, there is provided a method of an integrated circuit device, the method including: forming a first fin-type active region in a first area of a substrate and forming a second fin-type active region in a second area of the substrate; forming a spacer layer on the substrate, the spacer layer covering the first fin-type active region and the second fin-type active region; and etching the spacer layer, the first fin-type active region and the second fin-type active region to simultaneously form a first recess on the first fin-type active region, a second recess on the second fin-type active region, and a first fin insulating spacer, the first fin insulating spacer being a first residual portion of the spacer layer, which covers a sidewall of the first fin-type active region under the first recess.

According to yet another aspect of the inventive concept, there is provided a method of an integrated circuit device, the method including: forming a first fin-type active region and a first device isolation layer in a first area of a substrate and a second fin-type active region and a second device isolation layer in a second area of the substrate, the first device isolation layer covering both lower sidewalls of the first fin-type active region, and the second device isolation layer covering both lower sidewalls of the second fin-type active region; forming a first dummy gate structure on the first device isolation layer and a second dummy gate structure on the second device isolation layer, the first dummy gate structure covering the first fin-type active region, and the second dummy gate structure covering the second fin-type active region; forming a spacer layer, which covers the first fin-type active region, the second fin-type active region, the first dummy gate structure, and the second dummy gate structure; and etching the spacer layer, the first fin-type active region and the second fin-type active region to simultaneously form a first gate insulating spacer, a second gate insulating spacer, a first recess on the first fin-type active region, a second recess on the second fin-type active region, and a first fin insulating spacer, the first gate insulating spacer including a first portion of the spacer layer and covering both sidewalls of the first dummy gate structure, the second gate insulating spacer including a second portion of the spacer layer and covering both sidewalls of the second dummy gate structure, and the first fin insulating spacer including a third portion of the spacer layer and covering a sidewall of the first fin-type active region between the first device isolation layer and the first recess.

According to yet another aspect of the inventive concept, there is provided an integrated circuit device including: a memory area, and a logic area connected to or spaced apart from the memory area; a first transistor including a first source/drain region filled in a first recessed portion of a first fin-type active region in the memory area; a first device isolation layer covering both lower sidewalls of the first fin-type active region in the memory area; a second transistor including a second source/drain region filled in a second recessed portion of a second fin-type active region in the logic area; a second device isolation layer covering both lower sidewalls of the second fin-type active region in the logic area; a first fin insulating spacer covering a first sidewall of the first fin-type active region between the first source/drain region and the first device isolation layer, the first fin insulating spacer having a first height; and a second fin insulating spacer covering a second sidewall of the second fin-type active region between the second source/drain region and the second device isolation layer, the second fin insulating spacer having a second height smaller than the first height, or no second fin insulating spacer covering the second sidewall of the second fin-type active region between the second source/drain region and the second device isolation layer.

BRIEF DESCRIPTION OF THE DRAWINGS

Exemplary embodiments of the inventive concept will be more clearly understood from the following detailed description taken in conjunction with the accompanying drawings in which.

Figure 1:
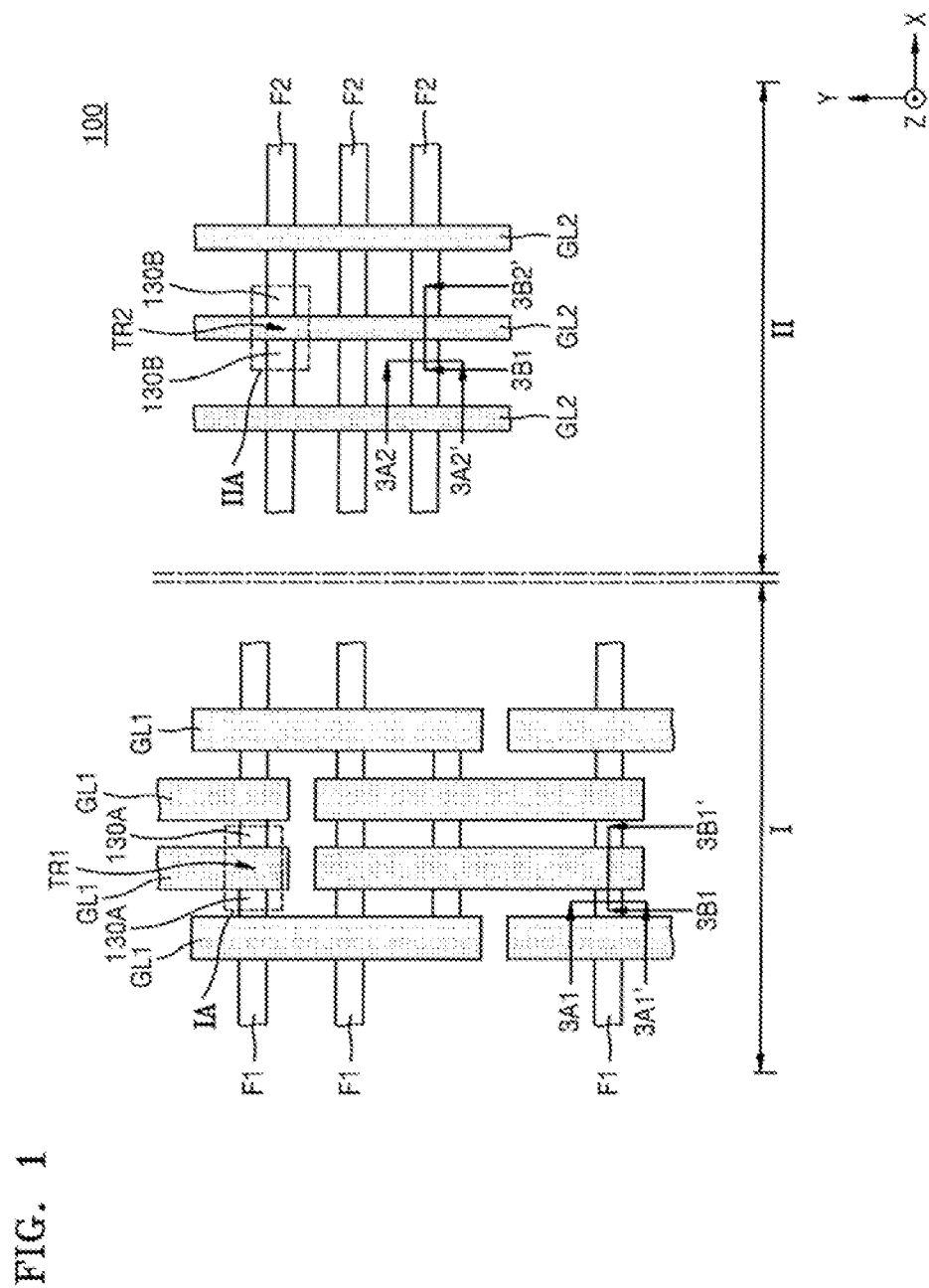
FIG. 1 is a planar layout diagram showing a main configuration of an integrated circuit device according to an exemplary embodiment of the inventive concept.

Since the drawings in FIGS. 1-18 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, exemplary embodiments of the inventive concept will be described with reference to the accompanying drawings. Like components will be denoted by like reference numerals throughout the specification, and repeated descriptions thereof will be omitted.

FIG. 1 is a planar layout diagram showing a main configuration of an integrated circuit device 100 according to an exemplary embodiment of the inventive concept.

Referring to FIG. 1, the integrated circuit device 100 includes a first area I and a second area II.

The first area I and the second area II may be connected to each other or spaced apart from each other. In an exemplary embodiment of the inventive concept, the first area I and the second area II may perform functions different from each other. In an exemplary embodiment of the inventive concept, the first area I and the second area II may perform the same function. In an exemplary embodiment of the inventive concept, the first area I may be one area selected from a memory area and a non-memory area, and the second area II may be the other area selected from the memory area and the non-memory area. For example, the memory area may include a static random access memory (SRAM) area, a dynamic RAM (DRAM) area, a magnetoresistive RAM (MRAM) area, a resistive RAM (RRAM) area, or a phase-change RAM (PRAM) area, and the non-memory area may include a logic area, without being limited thereto. In one example, the first area I may be a partial area constituting an SRAM area, and the second area II may be a partial area constituting a logic area. In another example, the first area I may be a partial area constituting an SRAM area, and the second area II may be another partial area constituting the SRAM area. In a further example, both of the first area I and the second area II are partial areas constituting an SRAM area, the first area I is an NMOS transistor area, and the second area II is a PMOS transistor area.

The first area I of the integrated circuit device 100 may include a plurality of first fin-type active regions F1 extending parallel to each other in a first direction (X direction), and a plurality of first gate lines GL1 on the plurality of first fin-type active regions F1, in which the plurality of first gate lines GL1 may extend in a second direction (Y direction) intersecting with the plurality of first fin-type active regions F1.

The plurality of first fin-type active regions F1 may have variable pitches, and thus, a separation distance between two adjacent first fin-type active regions F1 may vary depending upon positions thereof.

A first transistor TR1 may be formed at each of points at which the plurality of first fin-type active regions F1 intersect with the plurality of first gate lines GL1.

The second area II of the integrated circuit device 100 may include a plurality of second fin-type active regions F2 extending parallel to each other at regular pitches, and a plurality of second gate lines GL2 on the plurality of second fin-type active regions F2, in which the plurality of second gate lines GL2 may extend in a direction intersecting with the plurality of second fin-type active regions F2. Although FIG. 1 shows an example, in which the plurality of second fin-type active regions F2 extend in the first direction (X direction) and the plurality of second gate lines GL2 extend in the second direction (Y direction), according to an exemplary embodiment of the inventive concept, the extension direction of the plurality of second fin-type active regions F2 and the extension direction of the plurality of second gate lines GL2 are different from those shown in FIG. 1 and may be variously selected. A second transistor TR2 may be formed at each of points at which the plurality of second fin-type active regions F2 intersect with the plurality of second gate lines GL2.

Although FIG. 1 shows an example, in which the plurality of first fin-type active regions F1 are in the first area I and the plurality of second fin-type active regions F2 are in the second area II, the inventive concept is not limited thereto. For example, one or more fin-type active regions may be in each of the first area I and the second area II, and the number thereof is not particularly limited.

In an exemplary embodiment of the inventive concept, a density of structures including a combination of the plurality of first fin-type active regions F1 and the plurality of first gate lines GL1 in the first area I may be greater than a density of structures including a combination of the plurality of second fin-type active regions F2 and the plurality of second gate lines GL2 in the second area II.

Figure 2A:
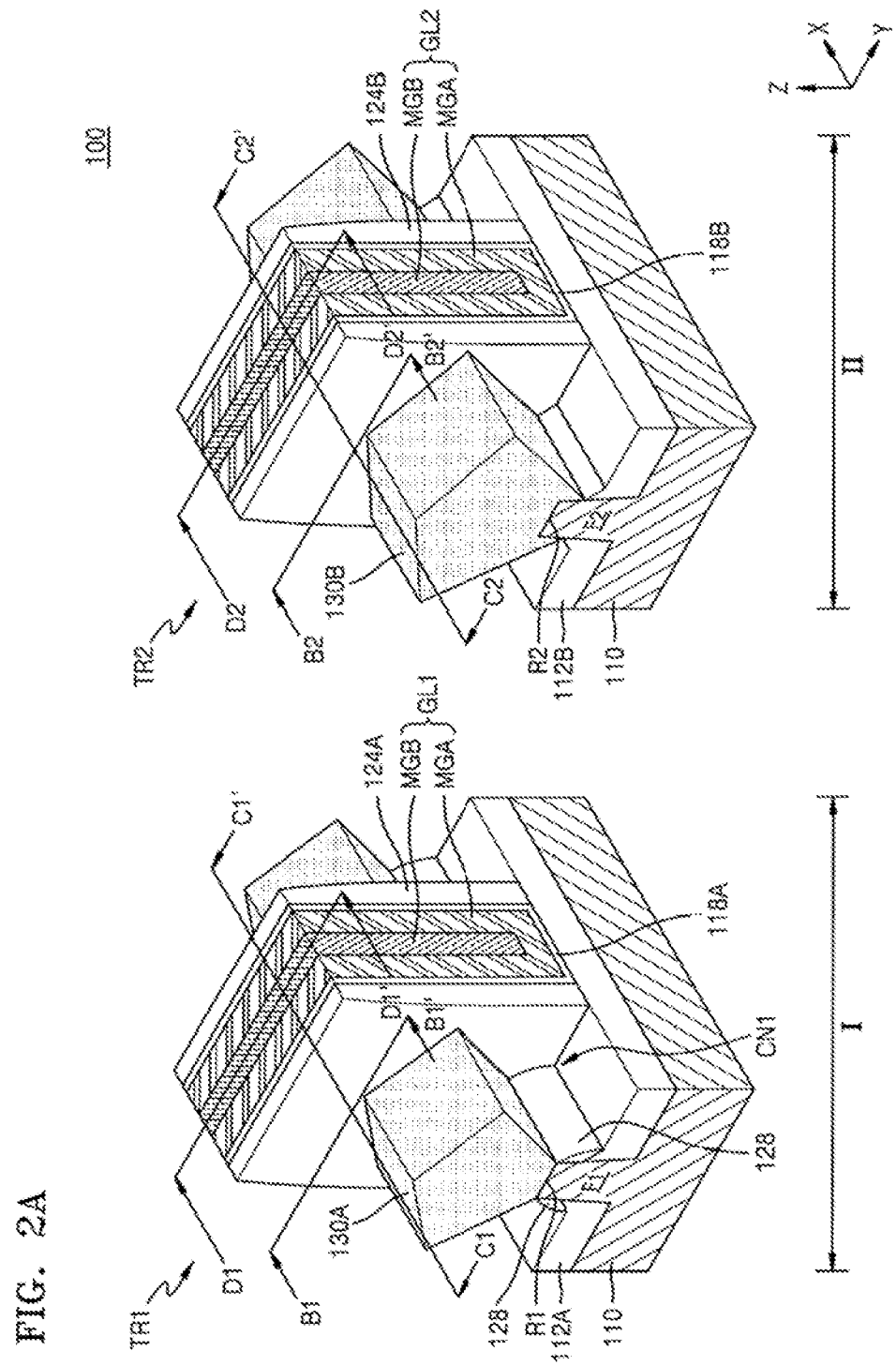
FIG. 2A shows perspective views of main components included in a dashed line area indicated by "IA" in FIG. 1 and a dashed line area indicated by "IIA" in FIG. 1.
Figure 2B:
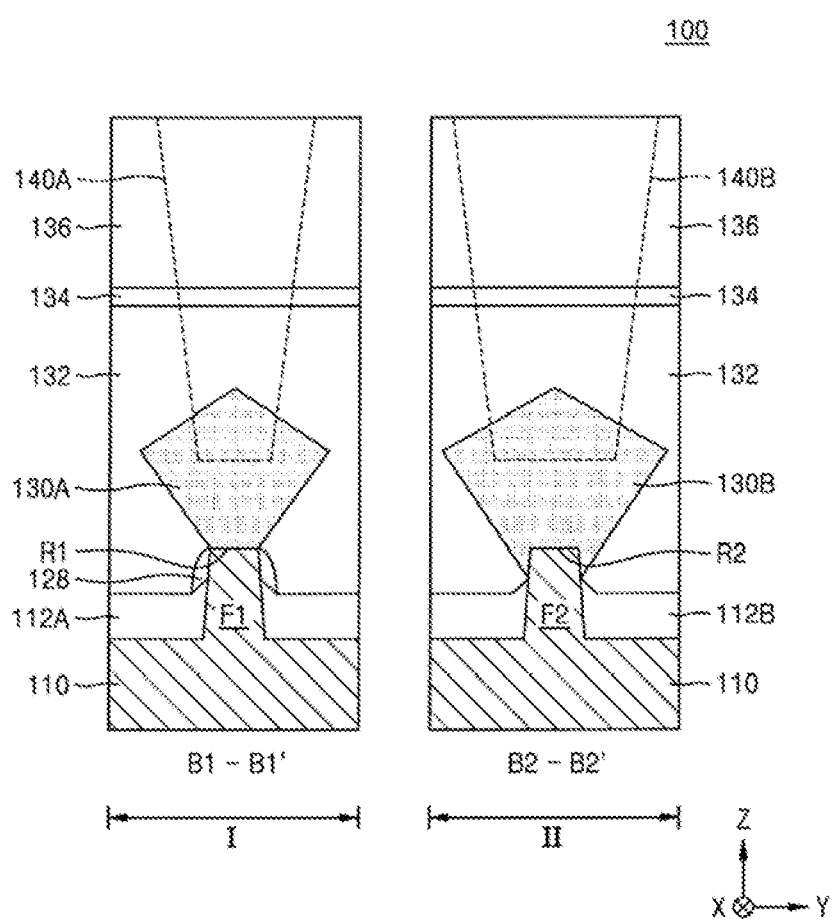
FIG. 2B shows cross-sectional views respectively taken along line B1-B1' and line B2-B2' of FIG. 2A.
Figure 2C:
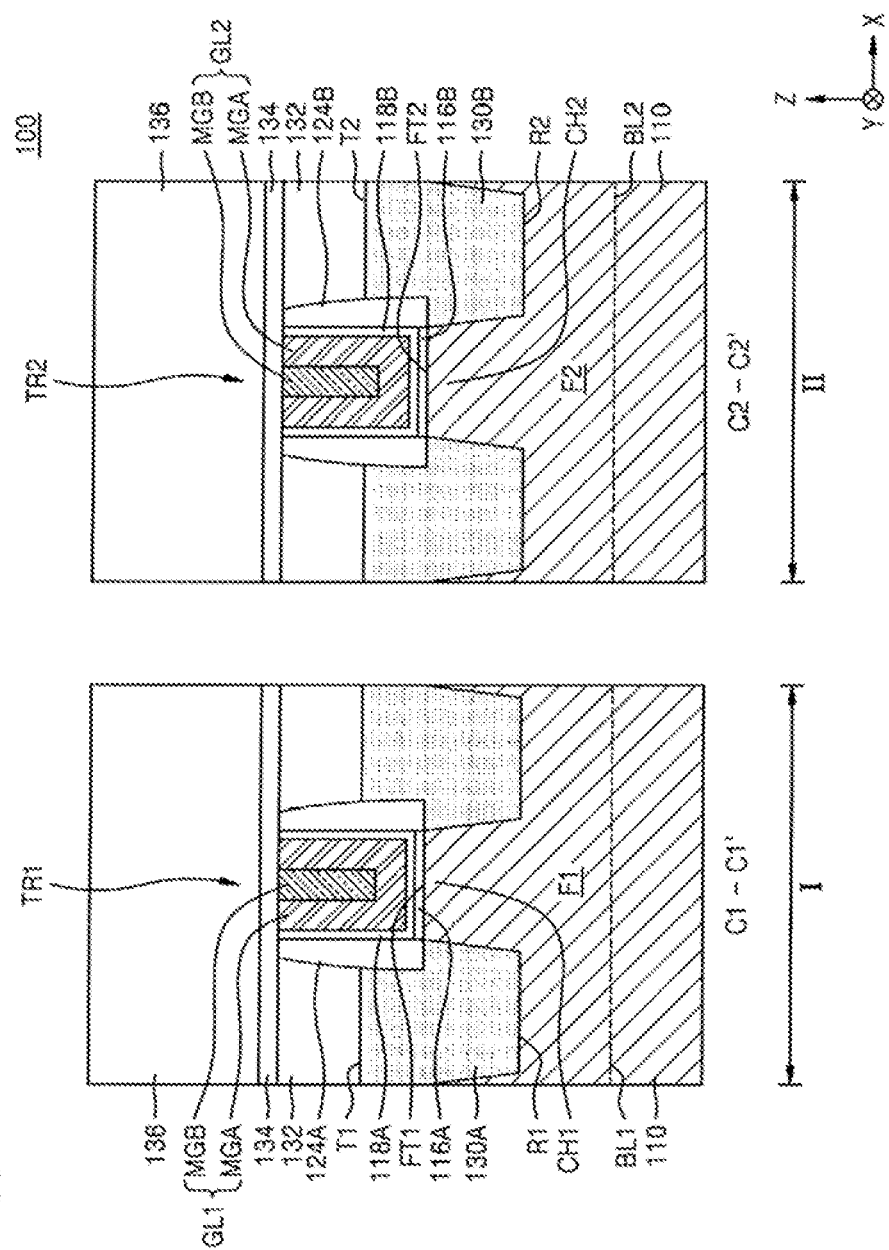
FIG. 2C shows cross-sectional views respectively taken along line C1-C1' and line C2-C2' of FIG. 2A.
Figure 2D:
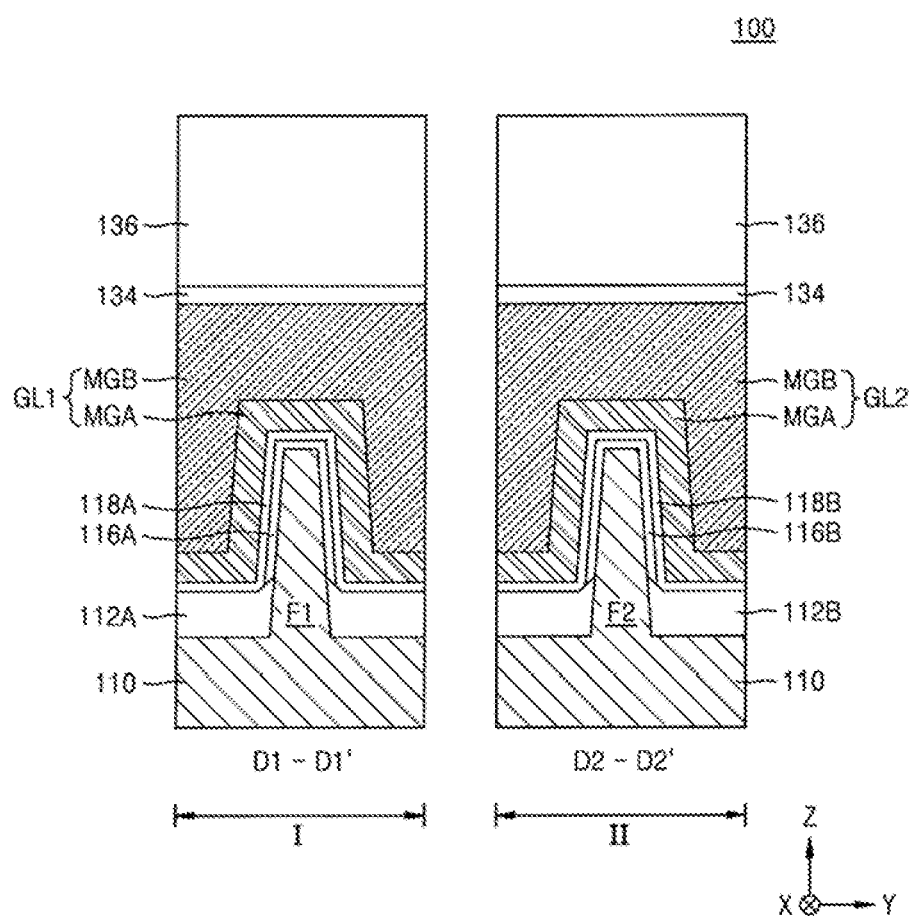
FIG. 2D shows cross-sectional views respectively taken along line D1-D1' and line D2-D2' of FIG. 2A.

FIG. 2A shows perspective views of main components included in a dashed line area indicated by "IA" in FIG. 1 and a dashed line area indicated by "IIA" in FIG. 1. FIG. 2B shows cross-sectional views respectively taken along line B1-B1' and line B2-B2' of FIG. 2A. FIG. 2C shows cross-sectional views respectively taken along line C1-C1' and line C2-C2' of FIG. 2A. FIG. 2D shows cross-sectional views respectively taken along line D1-D1' and line D2-D2' of FIG. 2A.

Referring to FIGS. 2A to 2D, the integrated circuit device 100 includes a first fm-type active region F1 in a first area I of a substrate 110 and a second fin-type active region F2 in a second area II of the substrate 110, in which the first fin-type active region F1 may protrude from the substrate 110 and may extend in a first direction (X direction), and the second fin-type active region F2 may protrude from the substrate 110 and may extend in the first direction (X direction). In FIG. 2C, the lowermost levels of the first and second fin-type active regions F1 and F2 are respectively marked by dashed lines BL1 and BL2.

In an exemplary embodiment of the inventive concept, the substrate 110 may include a semiconductor such as, for example, silicon (Si) or germanium (Ge), or a compound semiconductor such as, for example, silicon germanium (SiGe), silicon carbide (SiC), gallium arsenide (GaAs), gallium phosphide (GaP), gallium antimonide (GaSb), indium antimonide (InSb), indium arsenide (InAs), or indium phosphide (InP). In an exemplary embodiment of the inventive concept, the substrate 110 may include at least one of a Group III-V material and a Group IV material. The Group III-V material may be a binary, ternary, or quaternary compound including at least one Group III element and at least one Group V element. The Group III-V material may be a compound including at least one element of indium (In), gallium (Ga), and aluminum (Al) as a Group III element and including at least one element of arsenic (As), phosphorus (P), and antimony (Sb) as a Group V element. For example, the Group III-V material may be selected from among InP, $In_zGa_{1-z}As$ ($0 \le z \le 1$), and $Al_zGa_{1-z}As$ ($0 \le z \le 1$). The binary compound may be, for example, one of GaP, InP, GaAs, InAs, InSb, and GaSb. The ternary compound may be, for example, one of InGaP, InGaAs, AlInAs, InGaSb, GaAsSb, AlGaAs, AlInSb, AlGaP, InAsSb, and GaAsP. The Group IV material may be Si or Ge. However, the Group III-V material and the Group IV material, which may be used for the integrated circuit device according to the inventive concept, are not limited to the examples set forth above. The Group III-V material and the Group IV material such as Ge may be used as a channel material allowing a low-power high-speed transistor to be made. A high-performance CMOS may be formed by using a semiconductor substrate including a Group III-V material, for example, GaAs, which has a higher electron mobility than Si, and using a semiconductor substrate including a semiconductor material, for example, Ge, which has a higher hole mobility than Si. In an exemplary embodiment of the inventive concept, when an NMOS transistor is formed on the substrate 110, the substrate 110 may include one of the exemplary Group III-V materials set forth above. In an exemplary embodiment of the inventive concept, when a PMOS transistor is formed on the substrate 110, at least a portion of the substrate 110 may include Ge. In an exemplary embodiment of the inventive concept, the substrate 110 may have a silicon-on-insulator (SOI) structure, or a germanium-on-insulator (GOI) substrate. The substrate 110 may include a conductive region, for example, an impurity-doped well, or an impurity-doped structure.

In an exemplary embodiment of the inventive concept, a first channel region CH1 of the first fin-type active region F1 and a second channel region CH2 of the second fin-type active region F2 may include a single material. For example, all regions of the first and second fin-type active regions F1 and F2, including the first and second channel regions CH1 and CH2, may include Si. In an exemplary embodiment of the inventive concept, some portions of the first and second fin-type active regions F1 and F2 may include Ge, and other portions of the first and second fin-type active regions F and F2 may include Si.

In the first area I, both lower sidewalls of the first fin-type active region F1 are covered with a first device isolation layer 112A on the substrate 110, and the first channel region CH1 of the first fin-type active region F1 protrudes in a fin shape upwards from the first device isolation layer 112A along a direction (Z direction) perpendicular to a main plane (X-Y plane) of the substrate 110.

The first channel region CH1 of the first fin-type active region F1 is covered with a first interfacial layer 116A. A first gate insulating layer 118A and a first gate line GL1 extend over the first interfacial layer 116A and the first fin-type active region F1 in a second direction (Y direction) intersecting with the first direction (X direction) while covering the first channel region CH1. The first gate insulating layer 118A and the first gate line GL1 may extend while covering a top surface and both sidewalls of the first fin-type active region F1 and a top surface of the first device isolation layer 112A, in which the top surface and both sidewalls of the first fin-type active region F1 are covered with a first interfacial layer 116A. A first transistor TR1 may be formed at a point at which the first fin-type active region F1 intersects with the first gate line GL1. The first transistor TR1 may include the first gate line GL1, the first channel region CH1, and a first source/drain region on both sides of the first gate line GL.

In the second area II, both lower sidewalls of the second fin-type active region F2 are covered with a second device isolation layer 112B on the substrate 110, and the second channel region CH2 of the second fin-type active region F2 protrudes in a fin shape upwards from the second device isolation layer 112B along the direction (Z direction) perpendicular to the main plane (X-Y plane) of the substrate 110.

The second channel region CH2 of the second fin-type active region F2 is covered with a second interfacial layer 116B. A second gate insulating layer 118B and a second gate line GL2 extend over the second interfacial layer 116B and the second fin-type active region F2 in the second direction (Y direction) intersecting with the first direction (X direction) while covering the second channel region CH2. The second gate insulating layer 118B and the second gate line GL2 may extend while covering a top surface and both sidewalls of the second fin-type active region F2 and a top surface of the second device isolation layer 112B, in which the top surface and both sidewalls of the second fin-type active region F2 are covered with a second interfacial layer 116B. A second transistor TR2 may be formed at a point at which the second fin-type active region F2 intersects with the second gate line GL2. The second transistor TR2 may include the second gate line GL2, the second channel region CH2, and a second source/drain region on both sides of the second gate line GL2.

The first and second interfacial layers 116A and 116B may be respectively obtained by oxidizing exposed surfaces of the first and second fin-type active regions F1 and F2, and may respectively prevent interfacial defects between the first and second fin-type active regions F1 and F2 and the first and second gate insulating layers 118A and 118B. In an exemplary embodiment of the inventive concept, each of the first and second interfacial layers 116A and 116B may include a low-K dielectric material layer having a dielectric constant of about 9 or less, for example, a silicon oxide layer, a silicon oxynitride layer, or combinations thereof. The low-K dielectric material may also have a dielectric constant smaller than the dielectric constant of silicon oxide, and may include, for example, fluorine doped silicon oxide, or carbon doped silicon oxide. In an exemplary embodiment of the inventive concept, each of the first and second interfacial layers 116A and 116B may include a silicate, or combinations of a silicate and the exemplary materials set forth above.

Each of the first and second gate insulating layers 118A and 118B may include a silicon oxide layer, a high-K dielectric layer, or combinations thereof. The high-K dielectric layer may include a material having a dielectric constant greater than that of silicon oxide. For example, each of the first and second gate insulating layers 118A and 118B may have a dielectric constant of about 10 to about 25. The high-K dielectric layer may include a material selected from among hafnium oxide ($HfO_2$), hafnium oxynitride (HfON), hafnium silicon oxide (HfSiO), hafnium aluminum oxide (HfAlO), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$), lead zinc niobate ($Pb(Zn_{1/3}Nb_{2/3})O_3$), and combinations thereof, but a material constituting the high-K dielectric layer is not limited to the exemplary materials set forth above.

In an exemplary embodiment of the inventive concept, each of the first and second gate lines GL1 and GL2 may include a first metal-containing layer MGA and a second metal-containing layer MGB.

The first metal-containing layer MGA may adjust a work function of each of the first and second gate lines GL1 and GL2. The second metal-containing layer MGB may fill a space formed above the first metal-containing layer MGA. In an exemplary embodiment of the inventive concept, the first metal-containing layer MGA may include a metal including, for example, Ti, Ta, Al, or combinations thereof. In an exemplary embodiment of the inventive concept, the first metal-containing layer MGA may include, for example, a Ti layer, a TiN layer, a TiON layer, a TiO layer, a Ta layer, a TaN layer, a TaON layer, an oxygen-doped TiAlN (referred to as TiAlN(O) hereinafter) layer, an oxygen-doped TaAlN (referred to as TaAlN(O) hereinafter) layer, or combinations thereof. In an exemplary embodiment of the inventive concept, the first metal-containing layer MGA may include, for example, a TiON layer, a TiO layer, a TaON layer, a TiAlN(O) layer, a TaAlN(O) layer, or combinations thereof. In an exemplary embodiment of the inventive concept, the first metal-containing layer MGA may include a single layer or multiple layers.

The second metal-containing layer MGB may include an upper work-function-adjusting layer, a conductive barrier layer, a gap-fill metal layer, or combinations thereof. The upper work-function-adjusting layer may include, for example, TiAl, TiAlC, TiAlN, TiC, TaC, HfSi, or combinations thereof, without being limited thereto. The conductive barrier layer may include a metal nitride, for example, TiN, TaN, or combinations thereof, without being limited thereto.

The gap-fill metal layer may fill a gate space remaining on the conductive barrier layer. The gap-fill metal layer may include tungsten (W). Each of the upper work-function-adjusting layer, the conductive barrier layer, and the gap-fill metal layer may be formed by, for example, an atomic layer deposition (ALD), a chemical vapor deposition (CVD), or a physical vapor deposition (PVD) process. In an exemplary embodiment of the inventive concept, at least one of the upper work-function-adjusting layer, the conductive barrier layer, and the gap-fill metal layer may be omitted.

In an exemplary embodiment of the inventive concept, each of the first and second gate lines GL1 and GL2 may include a stacked structure of TiAlC/TiN/W, a stacked structure of TiN/TaN/TiAlC/TiN/W, or a stacked structure of TiN/TaN/TiN/TiAlC/TiN/W. In the stacked structures set forth above, a TiAlC layer or a TiN layer may serve as a metal-containing layer for adjusting work functions.

The first transistor TR1 may include a 3-dimensional-structured MOS transistor in which a channel is formed on the top surface and both sidewalls of the first fin-type active region F1, and the second transistor TR2 may include a 3-dimensional-structured MOS transistor in which a channel is formed on the top surface and both sidewalls of the second fin-type active region F2.

In the first area I, both sidewalls of each of the first interfacial layer 116A, the first gate insulating layer 118A, and the first gate line GL1 are covered with a first gate insulating spacer 124A.

In the second area II, both sidewalls of each of the second interfacial layer 116B, the second gate insulating layer 118B, and the second gate line GL2 are covered with a second gate insulating spacer 124B.

Each of the first and second gate insulating spacers 124A and 124B may include, for example, silicon nitride (SiN), carbon-containing silicon oxynitride (SiOCN), Silicon carbon nitride (SiCN), or combinations thereof. In an exemplary embodiment of the inventive concept, the first gate insulating spacer 124A may include a SiN layer contacting a sidewall of the first gate line GL1, and a SiOCN layer covering the sidewall of the first gate line GL1, with the SiN layer between the sidewall of the first gate line GL1 and the SiOCN layer, and the second gate insulating spacer 124B may include a SiN layer contacting a sidewall of the second gate line GL2, and a SiOCN layer covering the sidewall of the second gate line GL2, with the SiN layer between the sidewall of the second gate line GL2 and the SiOCN layer.

In the first area I, a first recess R1 is formed on a first fin portion of the first fin-type active region F1 on both sides of the first gate line GL, and a first source/drain region 130A fills the first recess R1. The first source/drain region 130A and the first gate line GL1 may be insulated from each other by the first gate insulating spacer 124A therebetween. The first source/drain region 130A may include a semiconductor layer that is epitaxially grown on the first fin-type active region F1 exposed at an inner wall of the first recess R1. The first source/drain region 130A may have a raised source/drain (RSD) structure having a top surface T1 that is at a level higher than that of a top surface FT1 of the first fin-type active region F1.

In the second area II, a second recess R2 is formed on a second fin portion of the second fin-type active region F2 on both sides of the second gate line GL2, and a second source/drain region 130B fills the second recess R2. The second source/drain region 130B and the second gate line GL2 may be insulated from each other by the second gate insulating spacer 124B therebetween. The second source/drain region 130B may include a semiconductor layer that is epitaxially grown on the second fin-type active region F2 exposed at an inner wall of the second recess R2. The second source/drain region 130B may have an RSD structure having a top surface T2 that is at a level higher than that of a top surface FT2 of the second fin-type active region F2.

In an exemplary embodiment of the inventive concept, each of the first and second source/drain regions 130A and 130B may have an embedded SiGe structure including a plurality of epitaxially grown SiGe layers. The plurality of SiGe layers may have different Ge contents. In an exemplary embodiment of the inventive concept, each of the first and second source/drain regions 130A and 130B may include an epitaxially grown Si layer or an epitaxially grown SiC layer. Although each of the first and second source/drain regions 130A and 130B is shown as having a specific cross-sectional shape in FIGS. 2A to 2C, the inventive concept is not limited thereto. For example, each of the first and second source/drain regions 130A and 130B may have various cross-sectional shapes such as, for example, circles, ellipses, or polygons including quadrangles, pentagons, hexagons and the like.

In an exemplary embodiment of the inventive concept, the size of the first source/drain region 130A in the first area I may be smaller than the size of the second source/drain region 130B in the second area II. For example, the width of the first source/drain region 130A in the second direction (Y direction) may be smaller than the width of the second source/drain region 130B in the second direction (Y direction). In addition, the height of the first source/drain region 130A may be smaller than the height of the second source/drain region 130B.

In the first area I and the second area II, an inter-gate dielectric 132 (see FIGS. 2B and 2C) is formed between the plurality of first and second gate lines GL1 and GL2 shown in FIG. 1. The inter-gate dielectric 132 may cover the first and second source/drain regions 130A and 130B between the plurality of first and second gate lines GL1 and GL2. The inter-gate dielectric 132 may include a silicon oxide layer, without being limited thereto.

In the first area I, both sidewalls of a portion of the first fin-type active region F1 under the first recess R1 are covered with a fin insulating spacer 128. Therefore, in the first area I, both sidewalls of the portion of the first fin-type active region F1 under the first recess R1 may be spaced apart from the inter-gate dielectric 132, with the fin insulating spacer 128 therebetween.

In the first area I, the fin insulating spacer 128 may cover both sidewalls of the first fin-type active region F1 under the first recess R1 and between the first device isolation layer 112A and the first source/drain region 130A.

In the first area I, the fin insulating spacer 128 may include a material the same as that of the first gate insulating spacer 124A. For example, the fin insulating spacer 128 may include SiOCN, SiCN, or combinations thereof.

In an exemplary embodiment of the inventive concept, the fin insulating spacer 128 and the first gate insulating spacer 124A may be integrally connected to each other. For example, the fin insulating spacer 128 and the first gate insulating spacer 124A may be integrally connected to each other at a reentrant corner CN1 (see FIG. 2A) between the first gate line GL1 and the first fin-type active region F1.

In the second area II, an insulating spacer corresponding to the fin insulating spacer 128 may not be formed on both sidewalls of a portion of the second fin-type active region F2 under the second recess R2. The height of the fin insulating spacer 128 on the second device isolation layer 112B may be substantially 0. Thus, as shown in FIG. 2B, in the second area II, both sidewalls of the portion of the second fin-type active region F2 under the second recess R2 may be covered with the second source/drain region 130B. In the second area II, both sidewalls of the portion of the second fin-type active region F2 under the second recess R2 may be spaced apart from the inter-gate dielectric 132, with portions of the second source/drain region 130B therebetween.

In the first area I and the second area II, a blocking insulating layer 134 is formed on the plurality of first and second gate lines GL1 and GL2 and the inter-gate dielectric 132. The blocking insulating layer 134 may prevent undesired foreign substances such as oxygen from penetrating into the plurality of first and second gate lines GL1 and GL2, thereby preventing undesired changes in threshold voltage in the transistors including the plurality of first and second gate lines GL1 and GL2. For example, as shown by dashed lines in FIG. 2B, first and second source/drain contact plugs 140A and 140B may be formed on and electrically connected to the first and second source/drain regions 130A and 130B, respectively. In this case, the blocking insulating layer 134 may contribute to preventing short circuits which may occur between the first gate line GL1 and the first source/drain contact plug 140A and between the second gate line GL2 and the second source/drain contact plug 140B. In an exemplary embodiment of the inventive concept, the blocking insulating layer 134 may include a layer including silicon and nitrogen. For example, the blocking insulating layer 134 may include a silicon nitride (SiN) layer, a silicon oxynitride (SiON) layer, a carbon-containing silicon oxynitride (SiOCN) layer, or combinations thereof. In an exemplary embodiment of the inventive concept, the blocking insulating layer 134 may have a thickness of about 20 Å to about 50 Å.

An interlayer dielectric 136 is formed on the blocking insulating layer 134. The interlayer dielectric 136 may include a silicon oxide layer, without being limited thereto.

In the integrated circuit device 100 shown in FIGS. 1 to 2D, in the first area I, both sidewalls of the portion of the first fin-type active region F1 under the first recess R1 are covered with the fin insulating spacer 128, thereby having better insulation properties between the first fin-type active region F1 and other conductive regions. The plurality of first fin-type active regions F1 may have variable pitches, and the plurality of second fin-type active regions F2 may have regular pitches. Also, the density of structures in the first area I may be greater than the density of structures in the second area II. Thus, the first fin-type active region F1 in the first area I may be more susceptible to short circuits with other conductive regions than the second fin-type active region F2 in the second area II may. Thus, only in the first area I out of the first area I and the second area II, the fin insulating spacer 128 is selectively formed on both sidewalls of the portion of the first fin-type active region F1 under the first recess R1, thereby eliminating the possibility of undesired short circuits in the first area I. As such, the integrated circuit device 100 includes devices having different structures to secure different electrical properties that are required depending upon the kinds and structures of the devices, thereby enhancing the performance and reliability of the integrated circuit device 100.

Figure 3A:
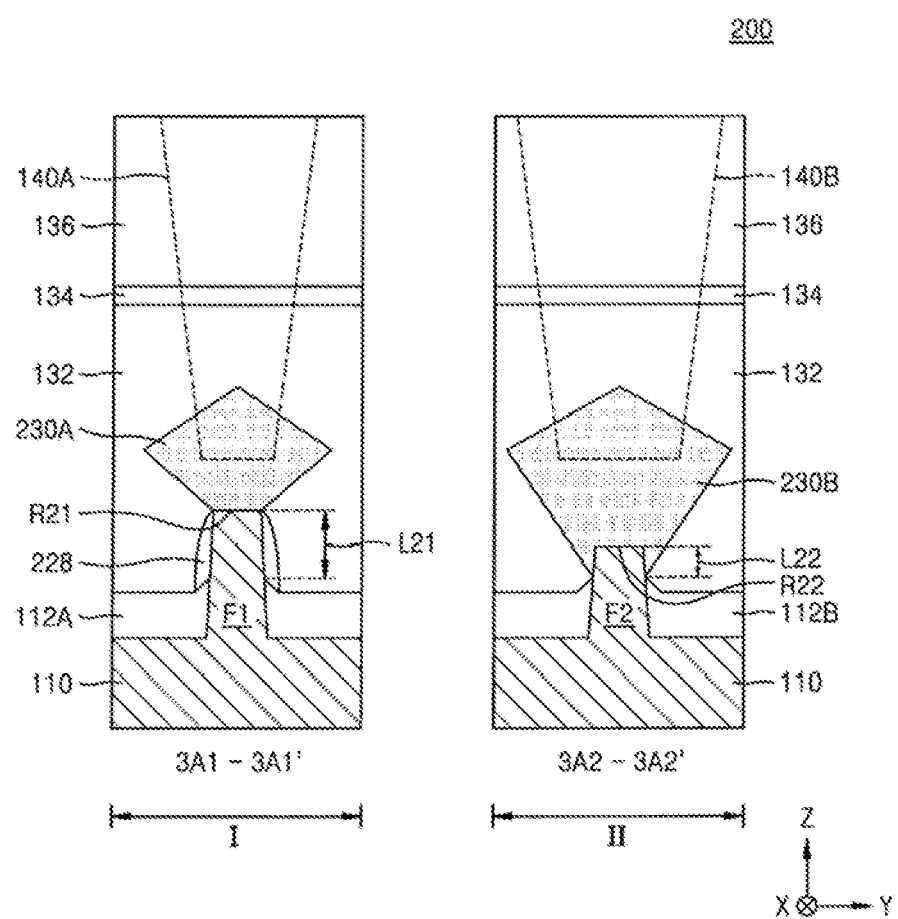
FIGS. 3A and 3B are cross-sectional views of an integrated circuit device according to an exemplary embodiment of the inventive concept.
Figure 3B:
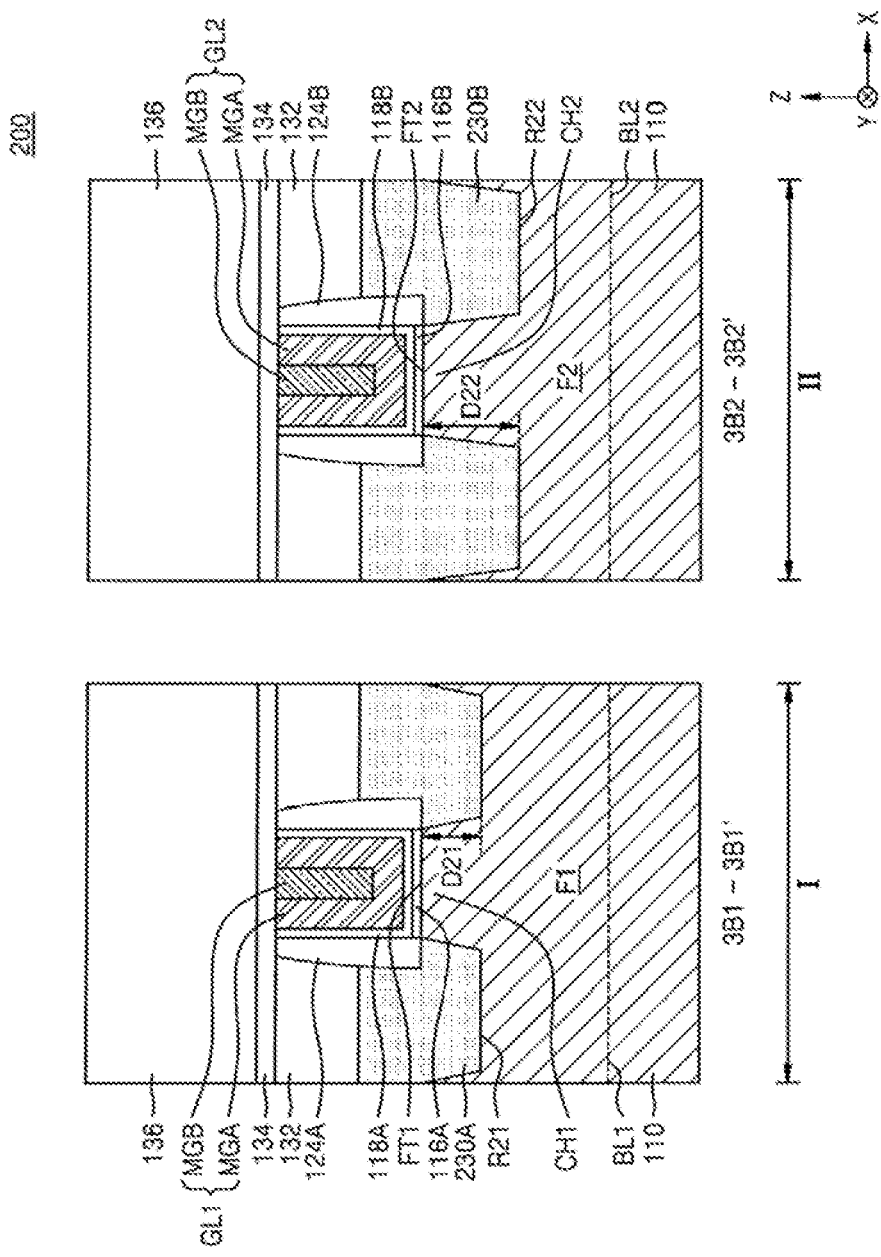

FIGS. 3A and 3B are cross-sectional views of an integrated circuit device according to an exemplary embodiment of the inventive concept. More specifically, FIG. 3A shows cross-sectional views showing configurations corresponding to cross-sections respectively taken along line 3A1-3A1' and line 3A2-3A2' of FIG. 1, and FIG. 3B shows cross-sectional views showing configurations corresponding to cross-sections respectively taken along line 3B1-3B1' and line 3B2-3B2' of FIG. 1. In FIGS. 3A and 3B, the same reference numerals as in FIGS. 1 to 2D denote the same members, and descriptions thereof will be omitted.

An integrated circuit device 200 shown in FIGS. 3A and 3B has a configuration mostly the same as that of the integrated circuit device 100 shown in FIGS. 2A to 2D. However, in the integrated circuit device 200 shown in FIGS. 3A and 3B, a depth D21 of a first recess R21 on the first fin-type active region F1 on both sides of the first gate line GL1, in the first area I, is smaller than a depth D22 of a second recess R22 on the second fin-type active region F2 on both sides of the second gate line GL2, in the second area II. As used herein, the term "depth" refers to lengths along a direction (Z direction) perpendicular to the main plane (X-Y plane) of the substrate 110.

In the first area I, a fin insulating spacer 228 is formed between the first device isolation layer 112A and a first source/drain region 230A in the first recess R21 and covers both sidewalls of the first fin-type active region F1. A vertical (Z direction) length L21 of the first fin-type active region F1, which is under the first recess R21 and protrudes upwards from the first device isolation layer 112A, in the first area I, may be greater than a vertical (Z direction) length L22 of the second fin-type active region F2, which is under the second recess R22 and protrudes upwards from the second device isolation layer 112B, in the second area II. The vertical length L21 is the length of the first fin-type active region F1 from the point that it protrudes out of the first device isolation layer 112A to the point that it reaches the bottom of the first recess R21. Similarly, the vertical length L22 is the length of the second fin-type active region F2 from the point that it protrudes out of the second device isolation layer 112B to the point that it reaches the bottom of the second recess R22.

More details of the fin insulating spacer 228 and the first and second source/drain regions 230A and 230B are mostly the same as the details of the fin insulating spacer 128 and the first and second source/drain regions 130A and 130B, which have been described with reference to FIGS. 2A to 2D. However, in the integrated circuit device 200, the size of the first source/drain region 230A in the first area I may be smaller than the size of the second source/drain region 230B in the second area II.

In the integrated circuit device 200 shown in FIGS. 3A and 3B, both sidewalls of a portion of the first fin-type active region F1 under the first recess R21, in the first area I, are covered with the fin insulating spacer 228, thereby having better insulation properties between the first fin-type active region F1 and other conductive regions that are adjacent thereto. The density of structures in the first area I may be greater than the density of structures in the second area II. Thus, the first fin-type active region F1 in the first area I may be more susceptible to short circuits with other conductive regions than the second fin-type active region F2 in the second area II may be. As such, only in the first area I out of the first area I and the second area II, the fin insulating spacer 228 is selectively formed on both sidewalls of the portion of the first fin-type active region F1 under the first recess R21, thereby eliminating the possibility of undesired short circuits in the first area I.

Figure 4A:
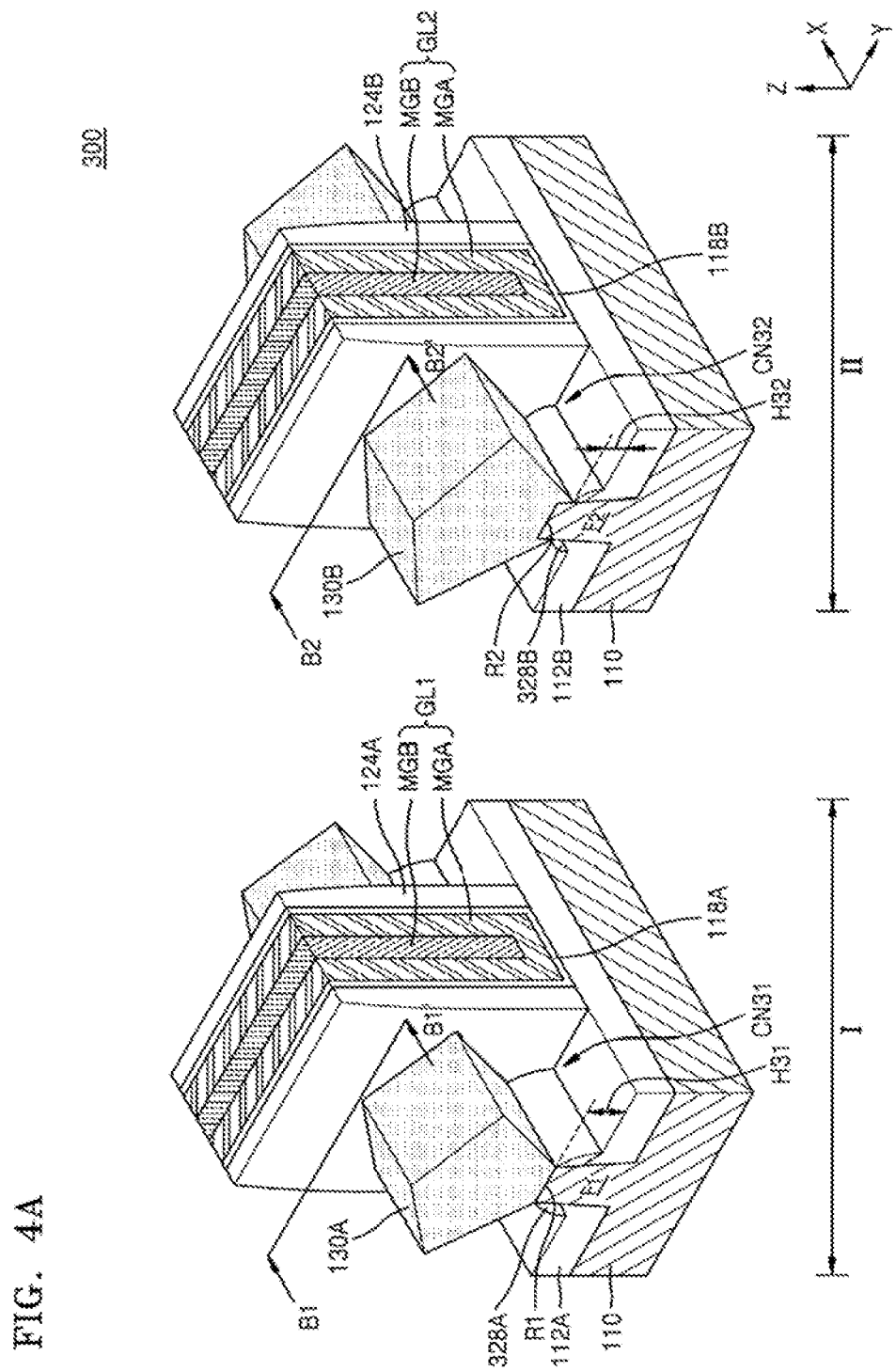
FIG. 4A shows perspective views of an integrated circuit device according to an exemplary embodiment of the inventive concept.
Figure 4B:
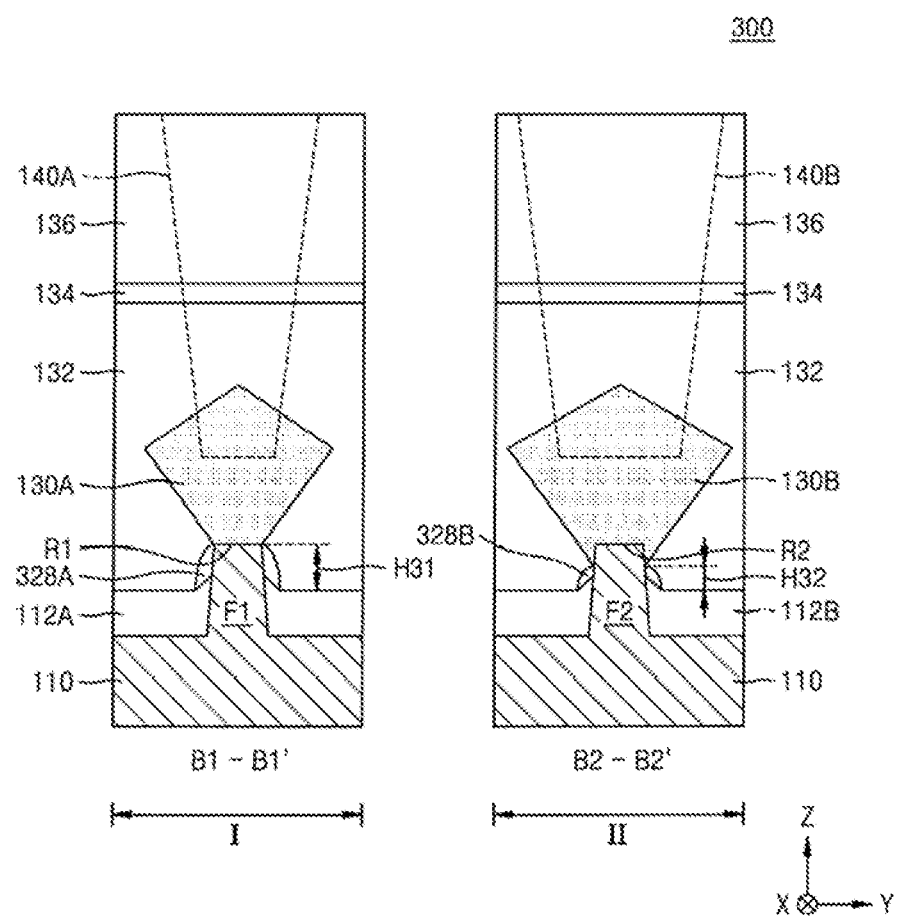
FIG. 4B shows cross-sectional views taken along line B1-B1' and line B2-B2' of FIG. 4A.

FIGS. 4A and 4B are diagrams for explaining an integrated circuit device according to an exemplary embodiment of the inventive concept, FIG. 4A shows perspective views of main components of an integrated circuit device 300, and FIG. 4B shows cross-sectional views respectively taken along line B1-B1' and line B2-B2'.

In FIGS. 4A and 4B, the same reference numerals as in FIGS. 1 to 2D denote the same members, and descriptions thereof will be omitted.

The integrated circuit device 300 shown in FIGS. 4A and 4B has a configuration mostly the same as that of the integrated circuit device 100 shown in FIGS. 2A to 2D. However, in the integrated circuit device 300 shown in FIGS. 4A and 4B, both sidewalls of the portions of the first and second fin-type active regions F1 and F2 under the first and second recesses R1 and R2, in the first and second areas I and II, are covered with a first fin insulating spacer 328A and a second fin insulating spacer 328B, respectively.

In the first area I, the first fin insulating spacer 328A is between the first device isolation layer 112A and the first source/drain region 130A and covers both sidewalls of the portion of the first fin-type active region F1 under the first recess R1. In the second area II, the second fin insulating spacer 328B is between the second device isolation layer 112B and the second source/drain region 130B and covers both sidewalls of the portion of the second fin-type active region F2 under the second recess R2. However, a height H31 of the first fin insulating spacer 328A is greater than a height H32 of the second fin insulating spacer 328B. As used herein, the term "height" refers to lengths along the direction (Z direction) perpendicular to the main plane (X-Y plane) of the substrate 110. In an exemplary embodiment of the inventive concept, although a difference in height between the first fin insulating spacer 328A and the second fin insulating spacer 328B may range from about 1 nm to about 15 nm, the inventive concept is not limited thereto.

In the first area I, the first fin-type active region F1 between the first device isolation layer 112A and the first source/drain region 130A may be spaced apart from the inter-gate dielectric 132, with the first fin insulating spacer 328A between the first fin-type active region F1 and the inter-gate dielectric 132. In the second area II, the second fin-type active region F2 between the second device isolation layer 112B and the second source/drain region 130B may be spaced apart from the inter-gate dielectric 132, with the second fin insulating spacer 328B between the second fin-type active region F2 and the inter-gate dielectric 132.

In the first area I, the first fin insulating spacer 328A may be integrally connected to the first gate insulating spacer 124A. For example, at a reentrant corner CN31 (see FIG. 4A) between the first gate line GL1 and the first fin-type active region F1, the first fin insulating spacer 328A may be integrally connected to the first gate insulating spacer 124A.

In the second area II, the second fin insulating spacer 328B may be integrally connected to the second gate insulating spacer 124B. For example, at a reentrant corner CN32 (see FIG. 4A) between the second gate line GL2 and the second fin-type active region F2, the second fin insulating spacer 328B may be integrally connected to the second gate insulating spacer 124B.

The first fin insulating spacer 328A and the second fin insulating spacer 328B may include the same material. More details of the first fin insulating spacer 328A and the second fin insulating spacer 328B are mostly the same as the details of the fin insulating spacer 128, which have been described with reference to FIGS. 2A to 2D.

In the integrated circuit device 300 shown in FIGS. 4A and 4B, in the first area I, both sidewalls of the portion of the first fin-type active region F1 under the first recess R1 are covered with the first fin insulating spacer 328A having a relatively great height, and in the second area II, both sidewalls of the portion of the second fin-type active region F2 under the second recess R2 are covered with the second fin insulating spacer 328B having a relatively small height. As such, the first and second fin insulating spacers 328A and 328B having different sizes from each other are formed to allow devices to secure different electrical properties that are required depending upon the kinds and structures of the devices, thereby enhancing the reliability of the integrated circuit device 300. For example, the integrated circuit device 300 is configured such that the first fin insulating spacer 328A having a relatively great height is included in an area relatively more prone to having short circuits between conductive regions, like in the first area I, and such that the second fin insulating spacer 328B having a relatively small height is included in an area relatively less prone to having short circuits between conductive regions, like in the second area II, thereby enhancing the reliability of the integrated circuit device 300. In the above example, the plurality of first fin-type active regions F1 may have variable pitches, and the plurality of second fin-type active regions F2 may have regular pitches. Also, the density of structures in the first area I may be greater than the density of structures in the second area II. Thus, the first fin-type active region F1 in the first area I may be more susceptible to short circuits with other conductive regions, and the second fin-type active region F2 in the second area II may be less susceptible to short circuits with other conductive regions.

Figure 5:
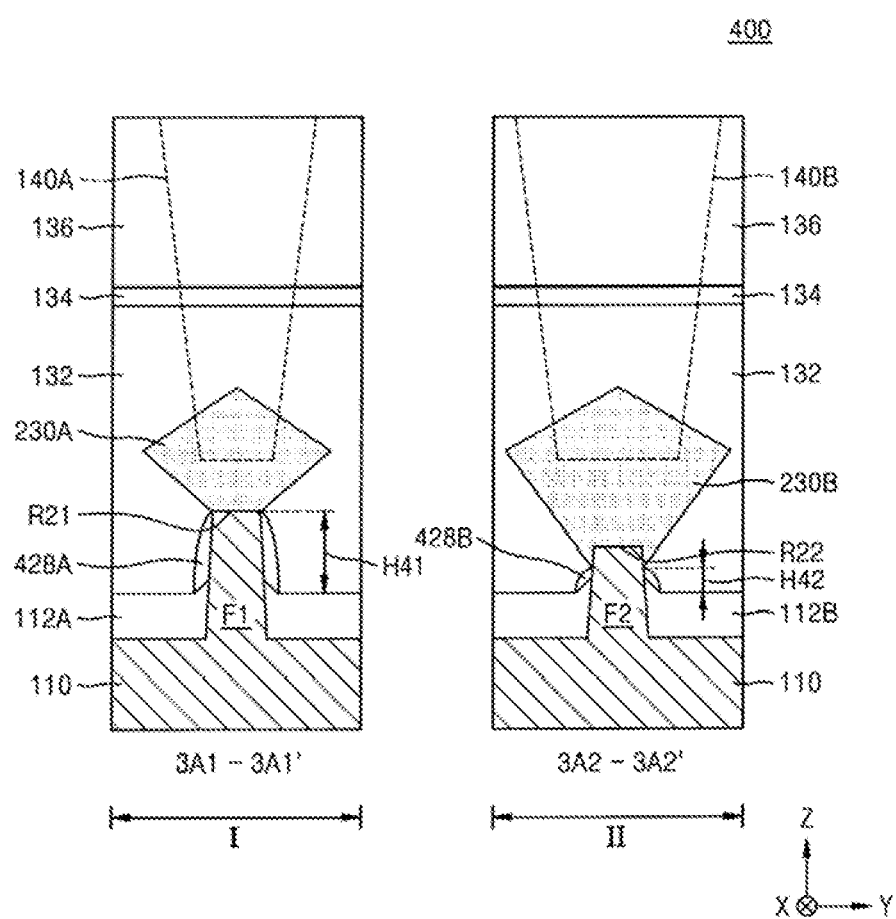
FIG. 5 shows cross-sectional views of an integrated circuit device according to an exemplary embodiment of the inventive concept.

FIG. 5 shows diagrams for explaining an integrated circuit device according to an exemplary embodiment of the inventive concept, and shows cross-sectional views showing configurations corresponding to cross-sections respectively taken along line 3A1-3A1' and line 3A2-3A2' of FIG. 1. In FIG. 5, the same reference numerals as in FIGS. 1 to 4D denote the same members, and descriptions thereof will be omitted.

An integrated circuit device 400 shown in FIG. 5 has a configuration mostly the same as that of the integrated circuit device 200 shown in FIGS. 3A to 3B. However, in the integrated circuit device 400 shown in FIG. 5, both sidewalls of the portions of the first and second fin-type active regions F1 and F2 under the first and second recesses R21 and R22, in the first and second areas I and II, are covered with a first fin insulating spacer 428A and a second fin insulating spacer 428B, respectively.

In the first area I, the first fin insulating spacer 428A is between the first device isolation layer 112A and the first source/drain region 230A, and covers both sidewalls of the portion of the first fin-type active region F1 under the first recess R21. In the second area II, the second fin insulating spacer 428B is between the second device isolation layer 112B and the second source/drain region 230B, and covers both sidewalls of the portion of the second fin-type active region F2 under the second recess R22. However, a height H41 of the first fin insulating spacer 428A is greater than a height H42 of the second fin insulating spacer 428B. As shown in FIG. 5, the upper portions of both sidewalls of the second fin-type active region F2 under the second recess R22 may also be covered by portions of the second source/drain region 230B.

In the first area I, the first fin-type active region F1 between the first device isolation layer 112A and the first source/drain region 230A may be spaced apart from the inter-gate dielectric 132, with the first fin insulating spacer 428A between the first fin-type active region F1 and the inter-gate dielectric 132. In the second area II, the second fin-type active region F2 between the second device isolation layer 112B and the second source/drain region 230B may be spaced apart from the inter-gate dielectric 132, with the second fin insulating spacer 428B between the second fin-type active region F2 and the inter-gate dielectric 132.

In the first area I, the first fin insulating spacer 428A may be integrally connected to the first gate insulating spacer 124A (see FIG. 3B). In the second area II, the second fin insulating spacer 428B may be integrally connected to the second gate insulating spacer 124B (see FIG. 3B).

The first fin insulating spacer 428A and the second fin insulating spacer 428B may include the same material. More details of the first fin insulating spacer 428A and the second fin insulating spacer 428B are mostly the same as the details of the fin insulating spacer 128, which have been described with reference to FIGS. 2A to 2D.

In the integrated circuit device 400 shown in FIG. 5, in the first area I, both sidewalls of the portion of the first fin-type active region F1 under the first recess R21 are covered with the first fin insulating spacer 428A having a relatively great height, and in the second area II, both sidewalls of the portion of the second fin-type active region F2 under the second recess R22 are covered with the second fin insulating spacer 428B having a relatively small height. The upper portions of both sidewalls of the second fin-type active region F2 under the second recess R22 may also be covered by portions of the second source/drain region 230B. As such, the first and second fin insulating spacers 428A and 428B having different sizes from each other are formed to allow devices to secure different electrical properties required depending upon the kinds and structures of the devices, thereby enhancing the reliability of the integrated circuit device 400.

Figure 6:
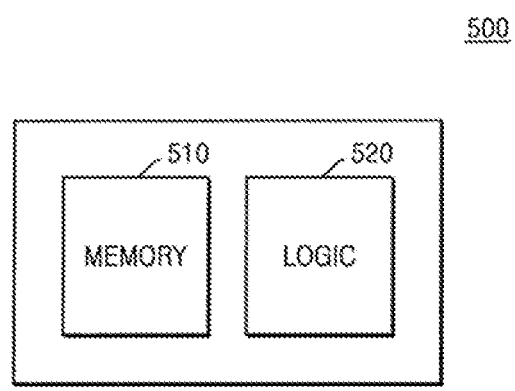
FIG. 6 is a block diagram of an integrated circuit device according to an exemplary embodiment of the inventive concept.

FIG. 6 is a block diagram of an integrated circuit device 500 according to an exemplary embodiment of the inventive concept.

Referring to FIG. 6, the integrated circuit device 500 includes a memory area 510 and a logic area 520.

The memory area 510 may include at least one of the configurations described as to the first area I with reference to FIGS. 1 to 5. The memory area 510 may include at least one of SRAM, DRAM, MRAM, RRAM, and PRAM.

The logic area 520 may include at least one of the configurations described as to the second area II with reference to FIGS. 1 to 5. The logic area 520 may include various logic cells including a plurality of circuit elements, such as, for example, a transistor, a register, and the like, as standard cells performing desired logic functions, such as, for example, a counter, a buffer, and the like. The logic cells may constitute, for example, AND, NAND, OR, NOR, exclusive OR (XOR), exclusive NOR (XNOR), inverter (INV), adder (ADD), buffer (BUF), delay (DLY), filter (FIL), multiplexer (MXT/MXIT), OR/AND/INVERTER (OAI), AND/OR (AO), AND/OR/INVERTER (AOI), D flip-flop, reset flip-flop, master-slave flip-flop, latch, or the like. However, the cells set forth above are merely examples, and the inventive concept is not limited thereto.

Figure 7A:
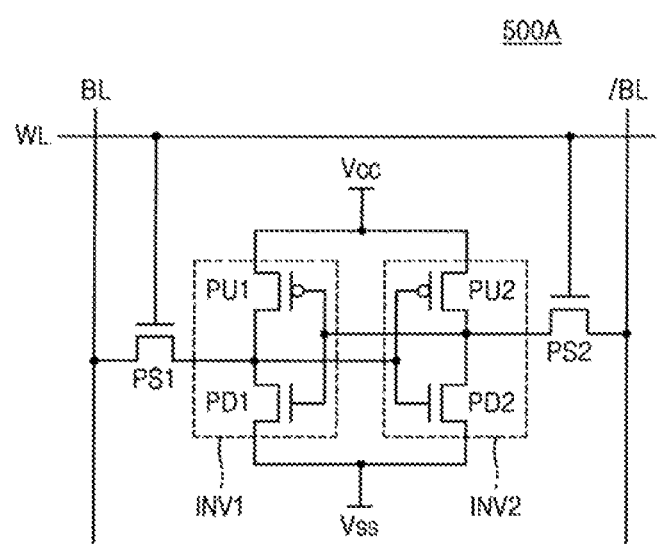
FIG. 7A is a circuit diagram of an exemplary memory device, which may be included in an integrated circuit device according to an exemplary embodiment of the inventive concept.
Figure 7B:
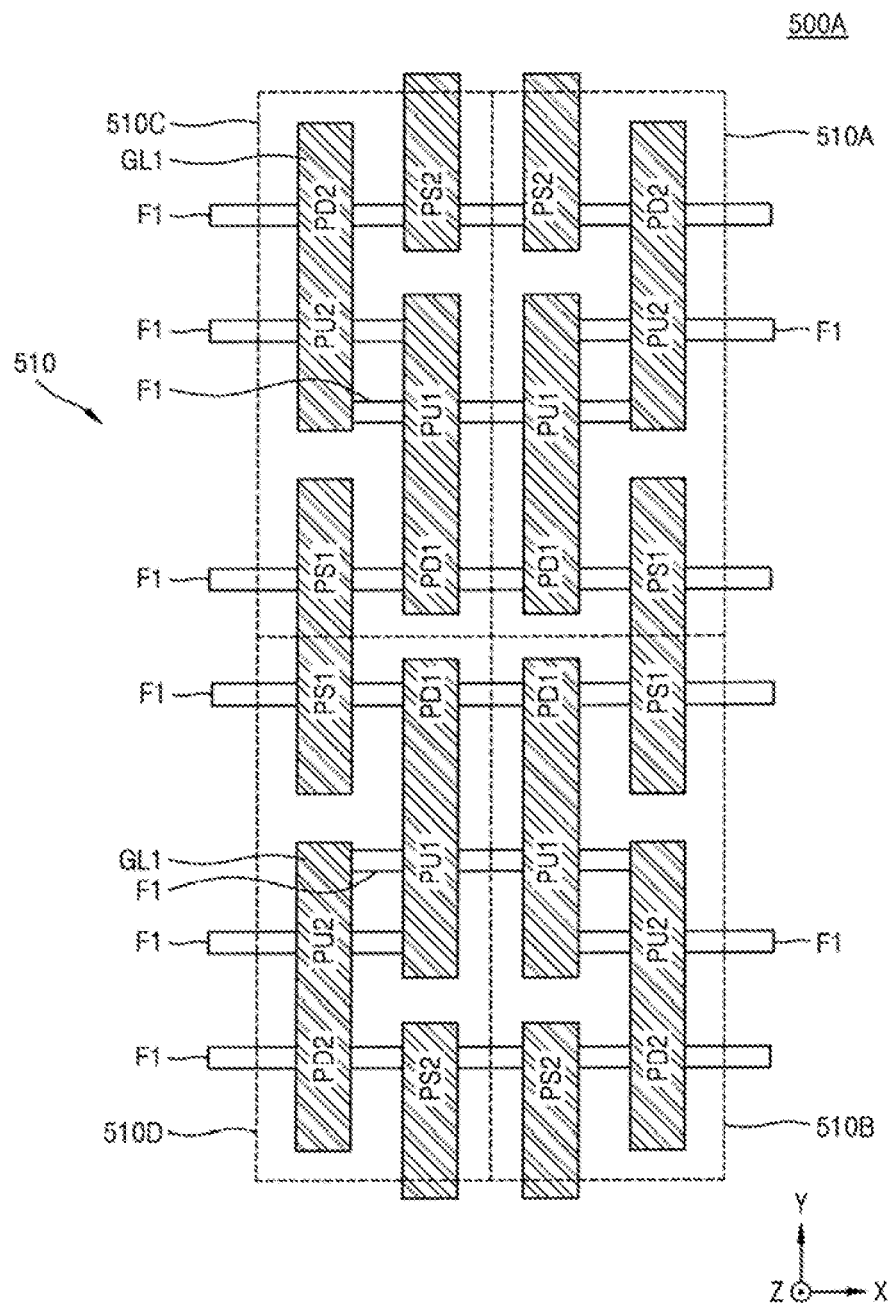
FIG. 7B is a plan view showing a main configuration of the memory device shown in FIG. 7A.

FIG. 7A is a circuit diagram of an exemplary memory device 500A, which may be included in the memory area 510 of the integrated circuit device 500 shown in FIG. 6. FIG. 7B is a plan view showing a main configuration of the memory device 500A shown in FIG. 7A.

FIG. 7A shows a circuit diagram of a 6T SRAM cell including six transistors. The structure of a 6T SRAM cell may store one bit of information. In FIGS. 7A and 7B, the same reference numerals as in FIGS. 1 to 6 denote the same members, and descriptions thereof will be omitted.

Referring to FIG. 7A, the memory device 500A may include a first inverter INV1 and a second inverter INV2, which are connected in parallel, between a power node Vcc and a ground node Vss, and a first pass transistor PS1 and a second pass transistor PS2, which are respectively connected to output nodes of the first and second inverters INV1 and INV2. The first pass transistor PS1 and the second pass transistor PS2 may be respectively connected to a bit line BL and a complementary bit line/BL. Each of the first pass transistor PS1 and the second pass transistor PS2 may be connected to a word line WL.

The first inverter INV1 includes a first pull-up transistor PU1 and a first pull-down transistor PD1, which are connected in series, and the second inverter INV2 includes a second pull-up transistor PU2 and a second pull-down transistor PD2, which are connected in series. The first pull-up transistor PU1 and the second pull-up transistor PU2 may include PMOS transistors, and the first pull-down transistor PD1 and the second pull-down transistor PD2 may include NMOS transistors. The first pass transistor PS1 and the second pass transistor PS2 may also include NMOS transistors.

To configure one latch circuit by the first inverter INV1 and the second inverter INV2, an input node of the first inverter INV1 is connected to an output node of the second inverter INV2, and an input node of the second inverter INV2 is connected to an output node of the first inverter INV1. Data may be stored in the cross-coupled first and second inverters INV1 and INV2.

Referring to FIG. 7B, the memory device 500A includes an SRAM array including a plurality of SRAM cells 510A, 510B, 510C, and 510D arranged in rows and columns on a substrate. FIG. 7B shows four SRAM cells 510A, 510B, 510C, and 510D, each of which includes six FinFETs.

Each of the plurality of SRAM cells 510A, 510B, 510C, and 510D may have the circuit configuration shown in FIG. 7A.

Each of the plurality of SRAM cells 510A, 510B, 510C, and 510D includes the plurality of first fin-type active regions F1 protruding from the substrate 110 (see FIGS. 2A to 5) and extending parallel to each other along the first direction (X direction).

In the plurality of SRAM cells 510A, 510B, 510C, and 510D, a plurality of first gate lines GL1 extend, on the plurality of first fin-type active regions F1, in the second direction (Y direction) intersecting with the plurality of first fin-type active regions F I.

The first pull-up transistor PU1, the first pull-down transistor PD1, the first pass transistor PS1, the second pull-up transistor PU2, the second pull-down transistor PD2, and the second pass transistor PS2, which constitute each of the plurality of SRAM cells 510A, 510B, 510C, and 510D, may be respectively realized by a plurality of FinFET devices, which are formed at points at which the plurality of first gate lines GL1 intersect with the plurality of first fin-type active regions F1.

In the SRAM cell 510A, transistors may be respectively formed at six intersection points between the plurality of first fin-type active regions F1 and the plurality of first gate lines GL1, and the transistors may include the first pass transistor PS1, the second pass transistor PS2, the first pull-down transistor PD1, the second pull-down transistor PD2, the first pull-up transistor PU1, and the second pull-up transistor PU2.

Each of the first pull-up transistor PU1 and the second pull-up transistor PU2 may include a PMOS transistor, and each of the first pull-down transistor PD1, the second pull-down transistor PD2, the first pass transistor PS1, and the second pass transistor PS2 may include an NMOS transistor.

The memory device 500A may include at least one of the fin insulating spacers 128 and 228 and the first fin insulating spacers 328A and 428A in the first areas I of the integrated circuit devices 100, 200, 300, and 400, which have been described with reference to FIGS. 1 to 5.

Figure 8:
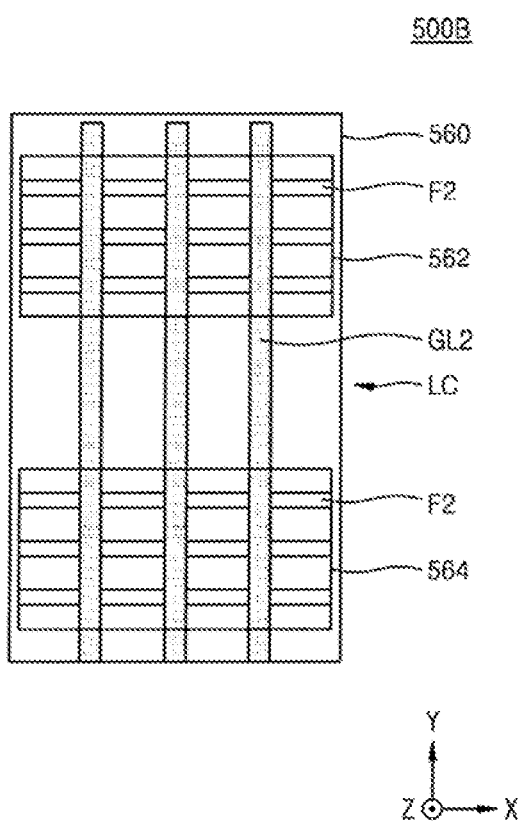
FIG. 8 is a plan view showing a main configuration of an exemplary logic device, which may be included in an integrated circuit device according to an exemplary embodiment of the inventive concept.

FIG. 8 is a plan view showing a main configuration of an exemplary logic device 500B, which may be included in the logic area 520 of the integrated circuit device 500 shown in FIG. 6. In FIG. 8, the same reference numerals as in FIGS. 1 to 6 denote the same members, and descriptions thereof will be omitted.

Referring to FIG. 8, the logic device 500B may have a cell LC on the substrate 110 (see FIGS. 2A to 5), in which the cell LC may have a cell boundary 560 and may include at least one logic function circuit.

The cell LC includes a first device area 562 and a second device area 564. In the first device area 562 and the second device area 564, the plurality of fin-type active regions F2 extend in the first direction (X direction).

In the first device area 562 and the second device area 564, the plurality of second fin-type active regions F2 may have regular pitches.

In the cell LC, the plurality of second gate lines GL2 extend in the second direction (Y direction) and intersect with the plurality of second fin-type active regions F2. Transistors may be respectively formed at intersection points at which the plurality of second gate lines GL2 intersect with the plurality of second fin-type active regions F2. Each of the plurality of second gate lines GL2 may be shared by a plurality of FinFET devices on the substrate 110.

The density of patterns including the plurality of first fin-type active regions F1 and the plurality of first gate lines GL1 in the memory device 500A may be greater than the density of patterns including the plurality of second fin-type active regions F2 and the plurality of second gate lines GL2 in the logic device 500B.

In an exemplary embodiment of the inventive concept, an insulating spacer corresponding to the fin insulating spacers 128 and 228 (see FIGS. 2A, 2B, and 3A) in the first areas I may not be formed on both sidewalls of each second fin-type active regions F2 in the logic device 500B, like in the second areas II of the integrated circuit devices 100 and 200 described with reference to FIGS. 1 to 3B.

In an exemplary embodiment of the inventive concept, like the second areas II of the integrated circuit devices 300 and 400 described with reference to FIGS. 4A to 5, the logic device 500B may include at least one of the second fin insulating spacers 328B and 428B, which respectively have heights smaller than those of the first fin insulating spacers 328A and 428A in the first areas I.

As described with reference to FIGS. 1 to 8, in the first area I of each of the integrated circuit devices 100, 200, 300, 400, and 500, both sidewalls of the portion of the first fin-type active region F1 under the first recess R1 or R21 are covered with at least one of the fin insulating spacers 128 and 228 and the first fin insulating spacers 328A and 428A, thereby having better insulation properties between the first fin-type active region F1 and other conductive regions that are adjacent thereto. The first fin-type active region F1 in the first area I may be more prone to having short circuits with surrounding conductive regions than the second fin-type active region F2 in the second area II. Thus, in the first area I, the fin insulating spacer 128 or 228 or the first fin insulating spacer 328A or 428A covering both sidewalls of the portion of the first fin-type active region F1 under the first recess R1 or R21 is formed, and in the second area II, a separate fin insulating spacer covering both sidewalls of the portion of the second fin-type active region F2 under the second recess R2 or R22 is not formed, or the second fin insulating spacer 328B or 428B respectively having a size smaller than that of the first fin insulating spacer 328A or 428A in the first area I is formed, thereby eliminating the possibility of undesired short circuits in the first area I. Therefore, unit devices constituting the integrated circuit device have different structures to secure different electrical properties that are required depending upon the kinds and structures of the unit devices, thereby enhancing the reliability of the integrated circuit device.

FIGS. 9A to 17B are cross-sectional views showing a method of fabricating an integrated circuit device according to a process order, according to an exemplary embodiment of the inventive concept. Among FIGS. 9A to 17B, FIGS. 9A, 10A, . . . , and 17A are cross-sectional views showing main configurations of the integrated circuit device, which correspond to cross-sections taken along line B1-B1' and line B2-B2' of FIG. 2A, according to a process order, and FIGS. 9B, 10B, . . . , and 17B are cross-sectional views showing main configurations of the integrated circuit device, which correspond to cross-sections taken along line C1-C1' and line C2-C2' of FIG. 2A, according to a process order. A method of fabricating the integrated circuit device 100 shown in FIGS. 1 to 2D will be described with reference to FIGS. 9A to 17B. In FIGS. 9A to 17B, the same reference numerals as in FIGS. 1 to 2D denote the same members, and descriptions thereof will be omitted.

Figure 9A:
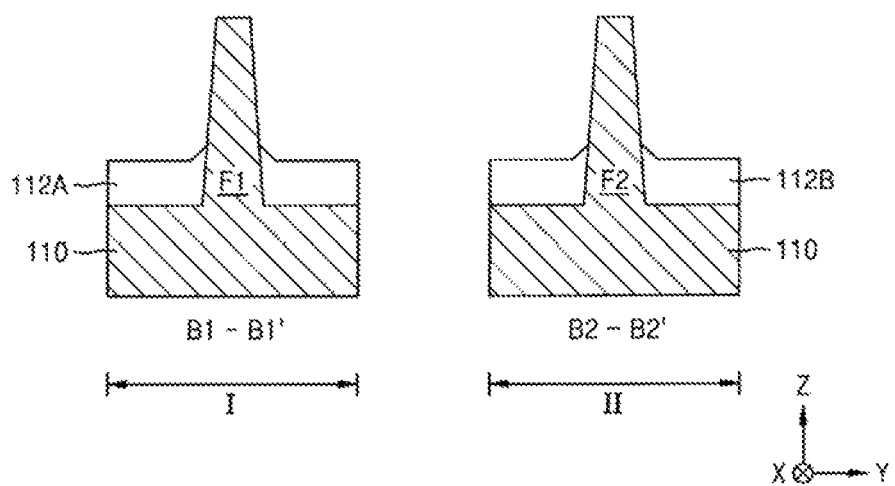
FIGS. 9A to 17B are cross-sectional views showing a method of fabricating an integrated circuit device according to a process order, according to an exemplary embodiment of the inventive concept, FIGS. 9A, 10A, . . . , and 17A are cross-sectional views showing main configurations of the integrated circuit device, which correspond to cross-sections taken along line B1-B1' and line B2-B2' of FIG. 2A, according to a process order, and FIGS. 9B, 10B, . . . , and 17B are cross-sectional views showing main configurations of the integrated circuit device, which correspond to cross-sections taken along line C1-C1' and line C2-C2' of FIG. 2A, according to a process order.
Figure 9B:
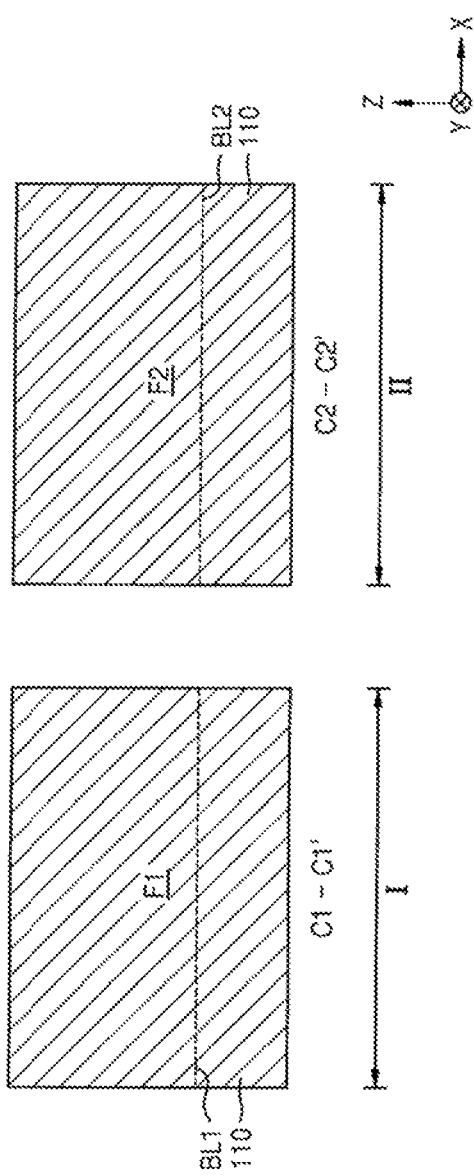

Referring to FIGS. 9A and 9B, a substrate 110 having a first area I and a second area II is prepared.

In the first area I and the second area II, the substrate 110 may have a MOS area. For example, each of the first area I and the second area II of the substrate 110 may be one of a PMOS transistor area and an NMOS transistor area. More details of the first area I and the second area II are the same as those described with reference to FIG. 1.

First and second fin-type active regions F1 and F2 are respectively formed in the first area I and the second area II by etching portions of the substrate 110, in which the first and second fin-type active regions F1 and F2 protrude upwards (Z direction) from a main plane (X-Y plane) of the substrate 110 and extend in a first direction (X direction). The first and second fin-type active regions F1 and F2 may include P-type or N-type impurity-doped regions depending upon channel types of MOS transistors that are desired to be formed in the first and second fin-type active regions F1 and F2.

After forming the first and second fin-type active regions F1 and F2, an insulating layer is formed on the substrate 110 and covers the first and second fin-type active regions F1 and F2, followed by performing etch back of the insulating layer, thereby forming first and second device isolation layers 112A and 112B. The first and second fin-type active regions F1 and F2 respectively protrude upwards from the first and second device isolation layers 112A and 112B and are exposed.

The first and second device isolation layers 112A and 112B may include, for example, a silicon oxide layer, a silicon nitride layer, a silicon oxynitride layer, or combinations thereof. The first and second device isolation layers 112A and 112B may include an insulating liner including a thermal oxide layer, and a gap-fill insulating layer on the insulating liner. In FIG. 9B, the lowermost levels of the first and second fin-type active regions F1 and F2 are respectively marked by dashed lines BL1 and BL2.

Figure 10A:
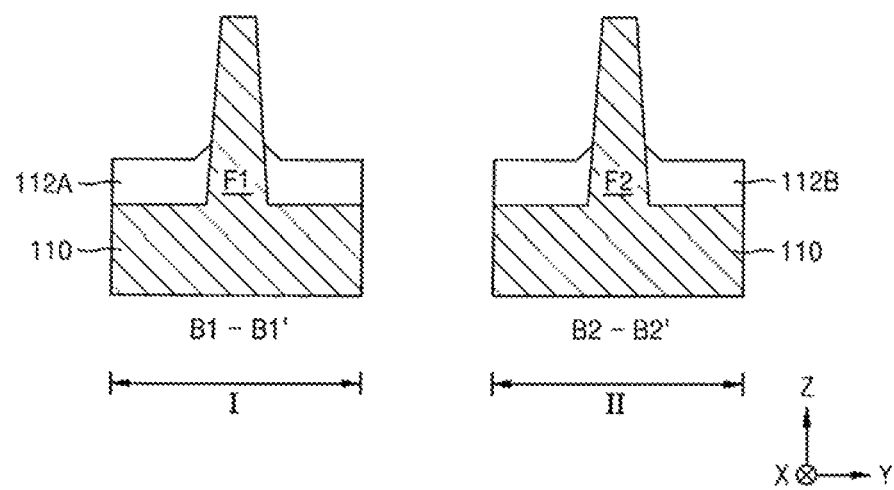
Figure 10B:
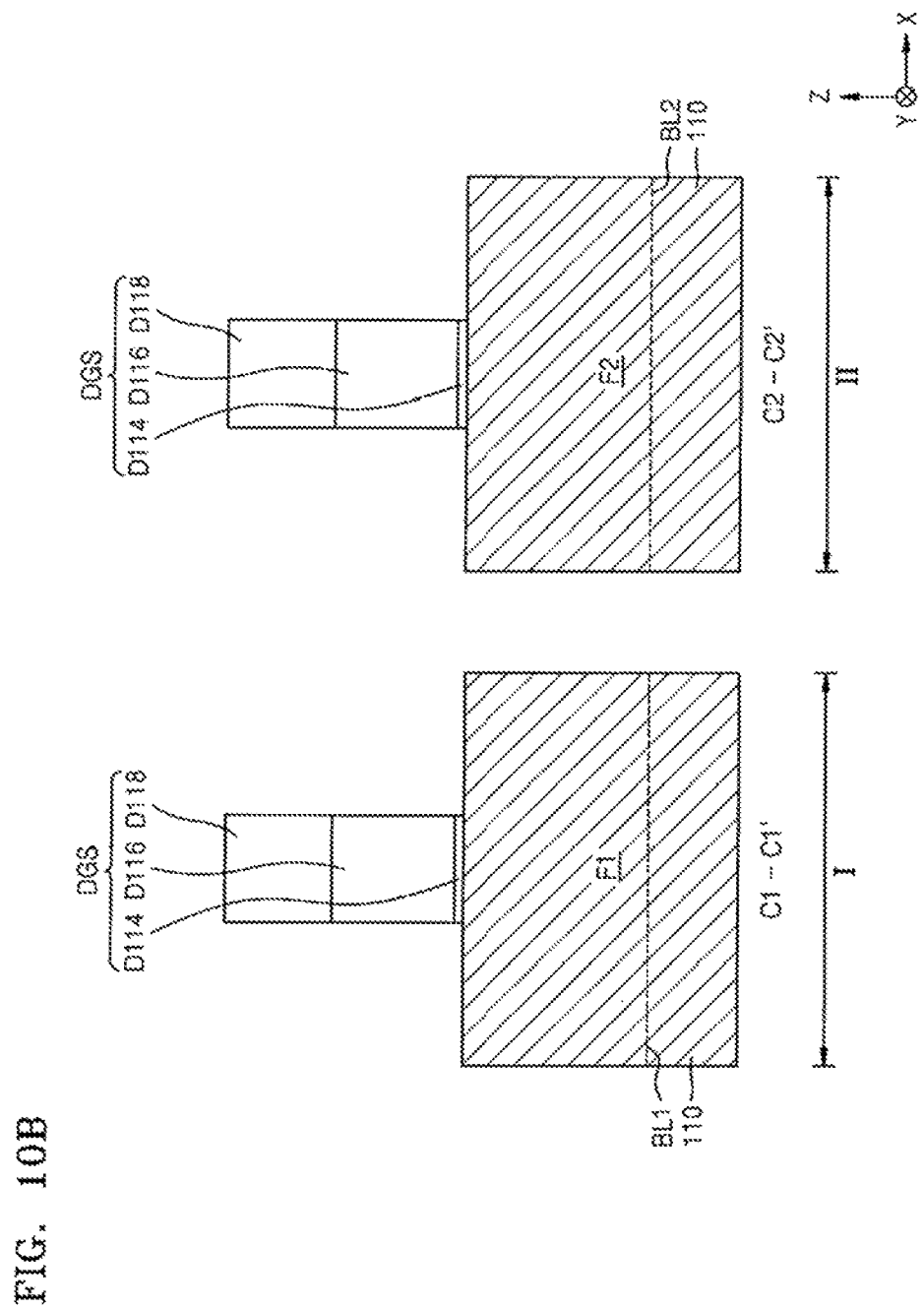

Referring to FIGS. 10A and 10B, a dummy gate structure DGS is formed on each of the first and second fin-type active regions F1 and F2 in the first area I and the second area II, in which the dummy gate structure DGS extends in a second direction (Y direction) to intersect with each of the first and second fin-type active regions F1 and F2.

The dummy gate structure DGS may include a dummy gate insulating layer D114, a dummy gate line D116, and a dummy gate capping layer D118, which are stacked on each of the first and second fin-type active regions F1 and F2 in this stated order. In an exemplary embodiment of the inventive concept, the dummy gate insulating layer D114 may include silicon oxide. The dummy gate line D116 may include polysilicon. The dummy gate capping layer D118 may include at least one of silicon oxide, silicon nitride, and silicon oxynitride.

Figure 11A:
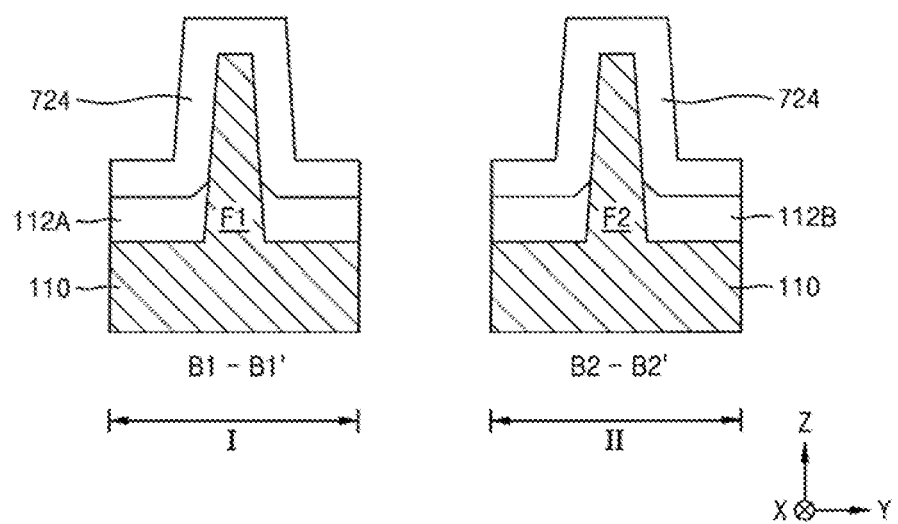

Referring to FIGS. 11A and 11B, an inner gate insulating spacer 722 is formed in each of the first area I and the second area II and covers both sidewalls of the dummy gate structure DGS, and then, a spacer layer 724 is formed and covers the first and second fin-type active regions F1 and F2, the dummy gate structure DGS, and the inner gate insulating spacer 722.

The inner gate insulating spacer 722 may include SiN. The spacer layer 724 may include, for example, SiOCN, SiCN, or combinations thereof. In an exemplary embodiment of the inventive concept, the spacer layer 724 may include a single layer including a SiOCN layer. In an exemplary embodiment of the inventive concept, the spacer layer 724 may include a SiOCN layer covering the inner gate insulating spacer 722, and an oxide layer covering the SiOCN layer. The spacer layer 724 may be formed by an ALD, a CVD, or a PVD process. For the CVD method, a plurality of gases containing a plurality of elements constituting the spacer layer 724 to be formed may be supplied together at the same time to the reaction chamber. For the ALD method, a plurality of gases containing a plurality of elements constituting the spacer layer 724 to be formed may be alternately supplied. For example, to form a SiOCN layer as the spacer layer 724, the plurality of gases may contain, hexachlorodisilane ($Si_2Cl_6$) gas as a silicon-containing gas, propylene ($C_3H_6$) gas a carbon containing gas, $NH_3$ gas as a nitrogen-containing gas, and $O_2$ gas as an oxygen-containing gas.

Figure 12A:
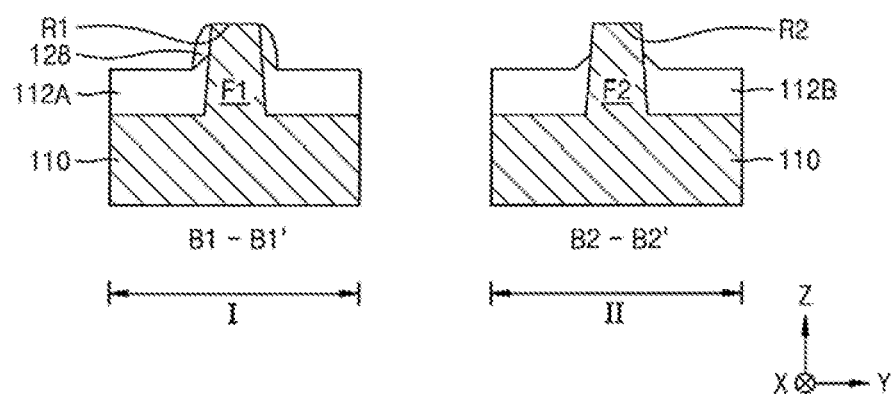
Figure 12B:
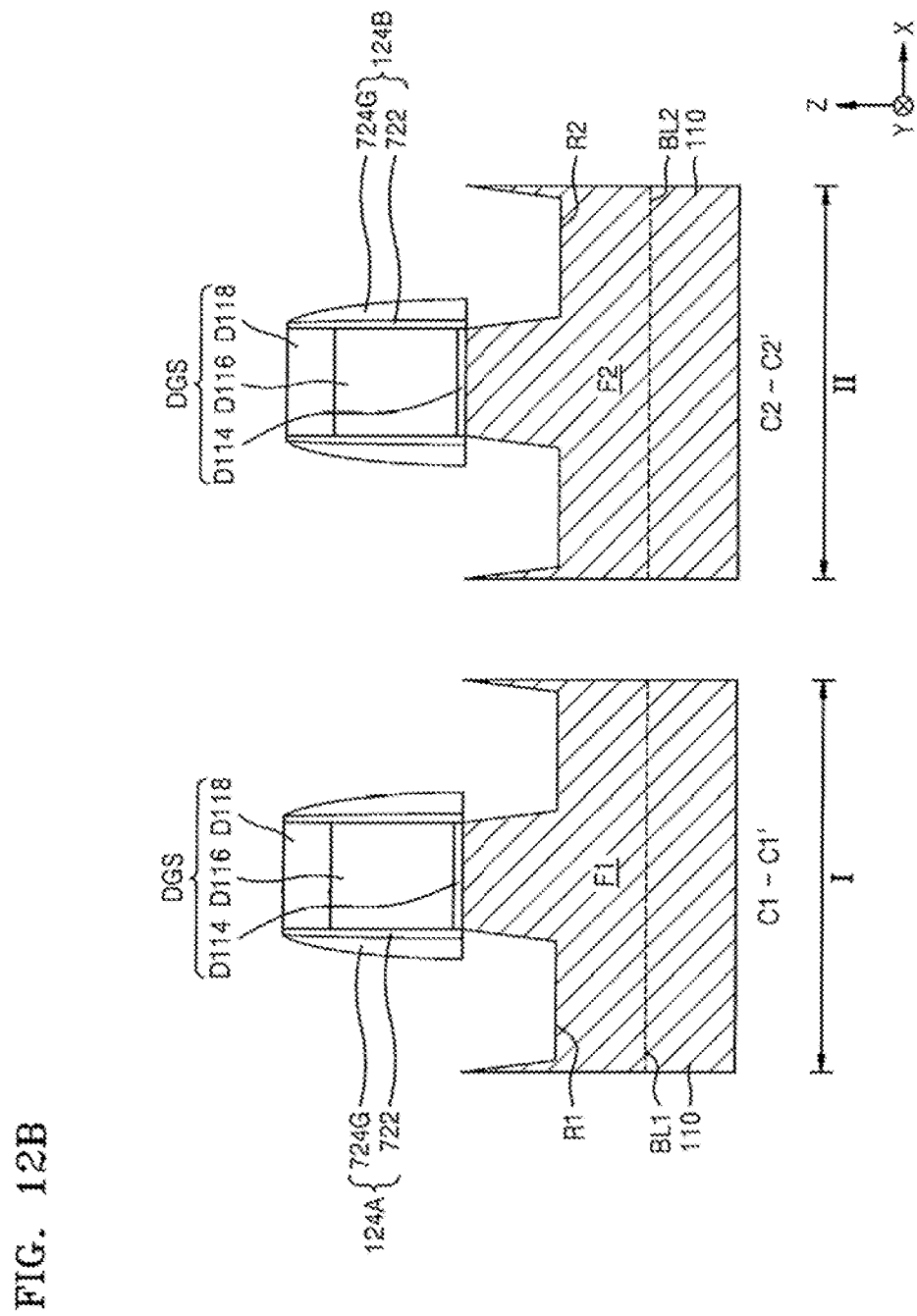

Referring to FIGS. 12A and 12B, an outer gate insulating spacer 724G is formed by performing etch-back of the spacer layer 724, in which the outer gate insulating spacer 724G covers the inner gate insulating spacer 722 on both sidewalls of the dummy gate structure DGS.

In the first area I, the inner gate insulating spacer 722 and the outer gate insulating spacer 724G may constitute a first gate insulating spacer 124A. In the second area II, the inner gate insulating spacer 722 and the outer gate insulating spacer 724G may constitute a second gate insulating spacer 124B.

During the formation of the outer gate insulating spacer 724G, as the etch-back of the spacer layer 724 is performed, the first and second fin-type active regions F1 and F2 may be exposed. The exposed first and second fin-type active regions F1 and F2 are also subjected to etch-back together with the spacer layer 724, thereby forming a first recess R1 on the first fin-type active region F1 in the first area I and forming a second recess R2 on the second fin-type active region F2 in the second area II. While the etch-back of the first and second fin-type active regions F1 and F2 is performed to form the first recess R1 and the second recess R2, since a certain thickness of the dummy gate capping layer D118 of the dummy gate structure DGS may be removed from a top surface thereof, the thickness of the dummy gate capping layer D118 may be reduced.

During the formation of the outer gate insulating spacer 724G and the first and second fin-type active regions F1 and F2, a fin insulating spacer 128, which is a portion of the spacer layer 724, remains on both sidewalls of a portion of the first fin-type active region F1 under the first recess R1, in the first area I. On the other hand, in the second area II, an insulating spacer corresponding to the fin insulating spacer 128 may not be formed on both sidewalls of a portion of the second fin-type active region F2 under the second recess R2.

In an exemplary embodiment of the inventive concept, to form the outer gate insulating spacer 724G, the first and second recesses R1 and R2, and the fin insulating spacer 128, the spacer layer 724 and the first and second fin-type active regions F1 and F2 may be sequentially subjected to a dry etching process and a wet cleaning process in this stated order.

A portion of the spacer layer 724 and portions of the first and second fin-type active regions F1 and F2 may be removed by the dry etching process, thereby forming a preliminary outer gate insulating spacer, a first preliminary recess on the first fin-type active region F1, and a second preliminary recess on the second fin-type active region F2, in which the preliminary outer gate insulating spacer may cover the inner gate insulating spacer 722 on both sidewalls of the dummy gate structure DGS. In addition, simultaneously with the formation of the first and second preliminary recesses, a preliminary fin insulating spacer may be formed between the first device isolation layer 112A the first preliminary recess and cover both sidewalls of the first fin-type active region F1, and may also be formed between the second device isolation layer 112B and the second preliminary recess and cover both sidewalls of the second fin-type active region F2.

During the wet cleaning process, a portion of the first fin-type active region F1 and a portion of the second fin-type active region F2, which are exposed to a wet cleaning solution, may be further removed. As a result, in the first area I, the first recess R1 extending up to a lower portion of the first gate insulating spacer 124A may be obtained from the first preliminary recess, and in the second area II, the second recess R2 extending up to a lower portion of the second gate insulating spacer 124B may be obtained from the second preliminary recess. In addition, during the wet cleaning process, a portion of the preliminary outer gate insulating spacer, which is exposed to the wet cleaning solution, may also be removed, thereby obtaining the outer gate insulating spacer 724G shown in FIG. 12B. Further, during the formation of the first and second recesses R1 and R2, the preliminary fin insulating spacer may also be exposed to the wet cleaning solution used in the wet cleaning process, whereby, in the first area I, the fin insulating spacer 128 shown in FIG. 12A may remain by removing only a portion of the preliminary fin insulating spacer, and in the second area II, an insulating spacer corresponding to the fin insulating spacer 128 may not be formed on both sidewalls of the portion of the second fin-type active region F2 under the second recess R2 by removing all of the preliminary fin insulating spacer.

In an exemplary embodiment of the inventive concept, in the formation process of the spacer layer 724, which has been described with reference to FIGS. 11A and 11B, the spacer layer 724 may include a SiOCN layer and an oxide layer covering the SiOCN layer. In this case, during the wet cleaning process, the oxide layer may be exposed to the wet cleaning solution and removed. As a result, after the first and second recesses R1 and R2 are obtained, the outer gate insulating spacer 724G remaining on the sidewalls of the dummy gate structure DGS, and the fin insulating spacer 128 remaining on both sidewalls of the portion of the first fin-type active region F1 under the first recess R1 may not include the oxide layer and may include only the SiOCN layer.

In an example of performing the dry etching process, a plasma etching process using $NH_3$, $CF_4$, or combinations thereof as an etching gas may be performed. In an example of performing the wet cleaning process, an HF cleaning solution may be used. However, the inventive concept is not limited to the examples set forth above and may be variously changed and modified.

The preliminary fin insulating spacer obtained immediately after the dry etching process is subjected to the wet cleaning process and then remains as the fin insulating spacer 128 in the first area I, and the size of the preliminary fin insulating spacer may be greater than the size of the fin insulating spacer 128 shown in FIG. 12A.

In the second area II, immediately after the dry etching process, before the wet cleaning process, the preliminary fin insulating spacer, which is a residual portion of the spacer layer 724, may remain on both sidewalls of the portion of the second fin-type active region F2 under the second recess R2. However, as the preliminary fin insulating spacer remaining in the second area II is subjected to the wet cleaning process, all of the preliminary fin insulating spacer may be removed together with a portion of the second fin-type active region F2 by the wet cleaning solution, whereby after the second recess R2 is formed on the second fin-type active region F2, an insulating spacer corresponding to the fin insulating spacer 128 may not remain on both sidewalls of the portion of the second fin-type active region F2 under the second recess R2.

In an exemplary embodiment of the inventive concept, during the dry etching process and the wet cleaning process, in the substrate 110, the density of patterns including the first fin-type active region F1 and the dummy gate structure DGS in the first area I may be greater than the density of patterns including the second fin-type active region F2 and the dummy gate structure DGS in the second area II. Due to the difference in pattern density between the first area I and the second area II, after the dry etching process and the wet cleaning process, the fin insulating spacer 128 may remain only in the first area I out of the first area I and the second area II, as shown in FIGS. 12A and 12B.

In an exemplary embodiment of the inventive concept, for the fin insulating spacer 128 to remain only in the first area I out of the first area I and the second area II, the preliminary fin insulating spacer in at least one of the first area I and the second area II may be subjected to a pre-treatment process, in which the preliminary fin insulating spacer is the residual portion of the spacer layer 724.

In an exemplary embodiment of the inventive concept, after the dry etching process, before the wet cleaning process, the pre-treatment process may be performed on the preliminary fin insulating spacer remaining in at least one of the first area I and the second area II in the substrate 110.

In an exemplary embodiment of the inventive concept, the pre-treatment process may be a plasma application process.

To perform the plasma application process, immediately after the dry etching process, plasma may be applied to the preliminary fin insulating spacer to damage the preliminary fin insulating spacer, which is the residual portion of the spacer layer 724 in the substrate 100. Although a gas used to form the plasma for damaging the preliminary fin insulating spacer may be selected from among $CF_4$, $O_2$, He, HBr, $NF_3$, Ar, $Cl_2$, $N_2$, $CH_3F$, $CH_4$, and combinations thereof, the inventive concept is not limited thereto. By performing the plasma application process, at least a portion of the preliminary fin insulating spacer may be damaged by the plasma. Upon the subsequent wet cleaning process, the removal rate and/or removal amount of a plasma-damaged portion of the preliminary fin insulating spacer by the wet cleaning solution may be greater than the removal rate and/or removal amount of a non-plasma-damaged portion of the preliminary fin insulating spacer by the wet cleaning solution. Thus, after the dry etching process, before the wet cleaning process, the plasma application process may be further performed on the preliminary fin insulating spacer in the first area I and/or the second area II, as needed, thereby increasing the consumption of the preliminary fin insulating spacer by the wet cleaning solution.

In an exemplary embodiment of the inventive concept, to control the size of the fin insulating spacer 128 in the first area I, the plasma application process may be selectively performed on the preliminary fin insulating spacer only in the first area I out of the first area I and the second area II, in which the preliminary fin insulating spacer is the residual portion of the spacer layer 724.

In an exemplary embodiment of the inventive concept, for an insulating spacer corresponding to the fin insulating spacer 128 not to remain on both sidewalls of the second fin-type active region F2 in the second area II, the plasma application process may be selectively performed on the preliminary fin insulating spacer only in the second area II out of the first area I and the second area II, in which the preliminary fin insulating spacer is the residual portion of the spacer layer 724. In this case, during the subsequent wet cleaning process, all of the preliminary fin insulating spacer, which is the residual portion of the spacer layer 724, in the second area II may be removed, and the fin insulating spacer 128 may remain only in the first area I.

In an exemplary embodiment of the inventive concept, the pre-treatment process may be an ion implantation process.

To perform the ion implantation process, immediately after the dry etching process, before the wet cleaning process, the ion implantation process may be performed on the preliminary fin insulating spacer to damage the preliminary fin insulating spacer, which is the residual portion of the spacer layer 724 in the substrate 100. Although ions used in the ion implantation process for damaging the preliminary fin insulating spacer may be obtained from a gas including Ge, $BF_2$, As, or combinations thereof, the inventive concept is not limited thereto. By performing the ion implantation process, at least a portion of the preliminary fin insulating spacer may be damaged by ions implanted into an inside thereof. Upon the subsequent wet cleaning process, the removal rate and/or removal amount of an ion-implantation-damaged portion of the preliminary fin insulating spacer by the wet cleaning solution may be greater than the removal rate and/or removal amount of a non-ion-implantation-damaged portion of the preliminary fin insulating spacer by the wet cleaning solution. Thus, after the dry etching process, before the wet cleaning process, the ion implantation process may be further performed on the preliminary fin insulating spacer, as needed, thereby increasing the consumption of the preliminary fin insulating spacer by the wet cleaning solution.

In an exemplary embodiment of the inventive concept, to control the size of the fin insulating spacer 128 in the first area I, the ion implantation process may be selectively performed on the residual portion of the spacer layer 724 only in the first area I out of the first area I and the second area II. In an exemplary embodiment of the inventive concept, for an insulating spacer corresponding to the fin insulating spacer 128 not to remain on both sidewalls of the second fin-type active region F2 in the second area II, the ion implantation process may be selectively performed on the residual portion of the spacer layer 724 only in the second area II out of the first area I and the second area II. In this case, during the subsequent wet cleaning process, all of the preliminary fin insulating spacer, which is the residual portion of the spacer layer 724, in the second area II may be removed, and the fin insulating spacer 128 may remain only in the first area I.

In an exemplary embodiment of the inventive concept, the pre-treatment process may be a combination of the plasma application process and the ion implantation process as described above.

Figure 13A:
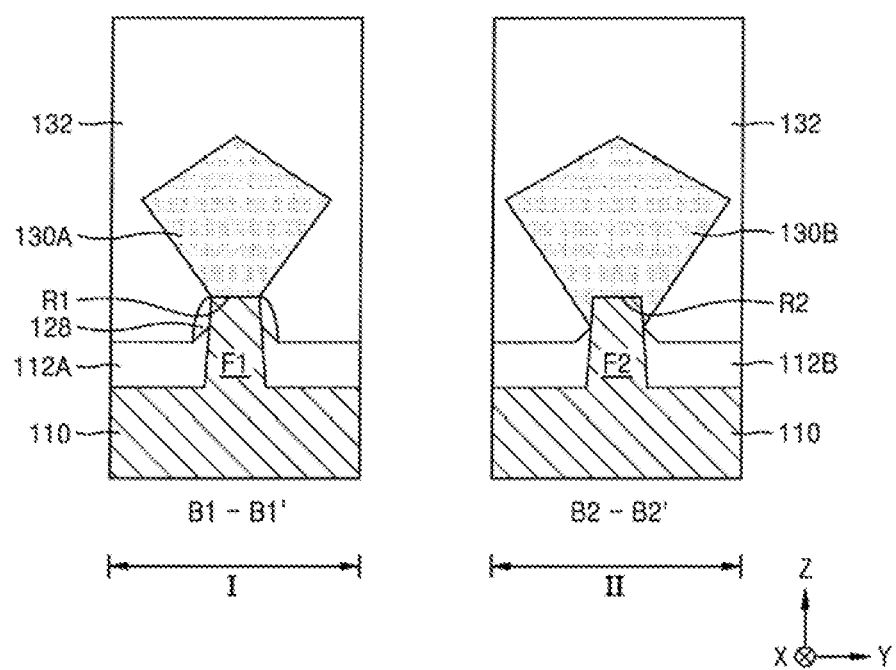
Figure 13B:
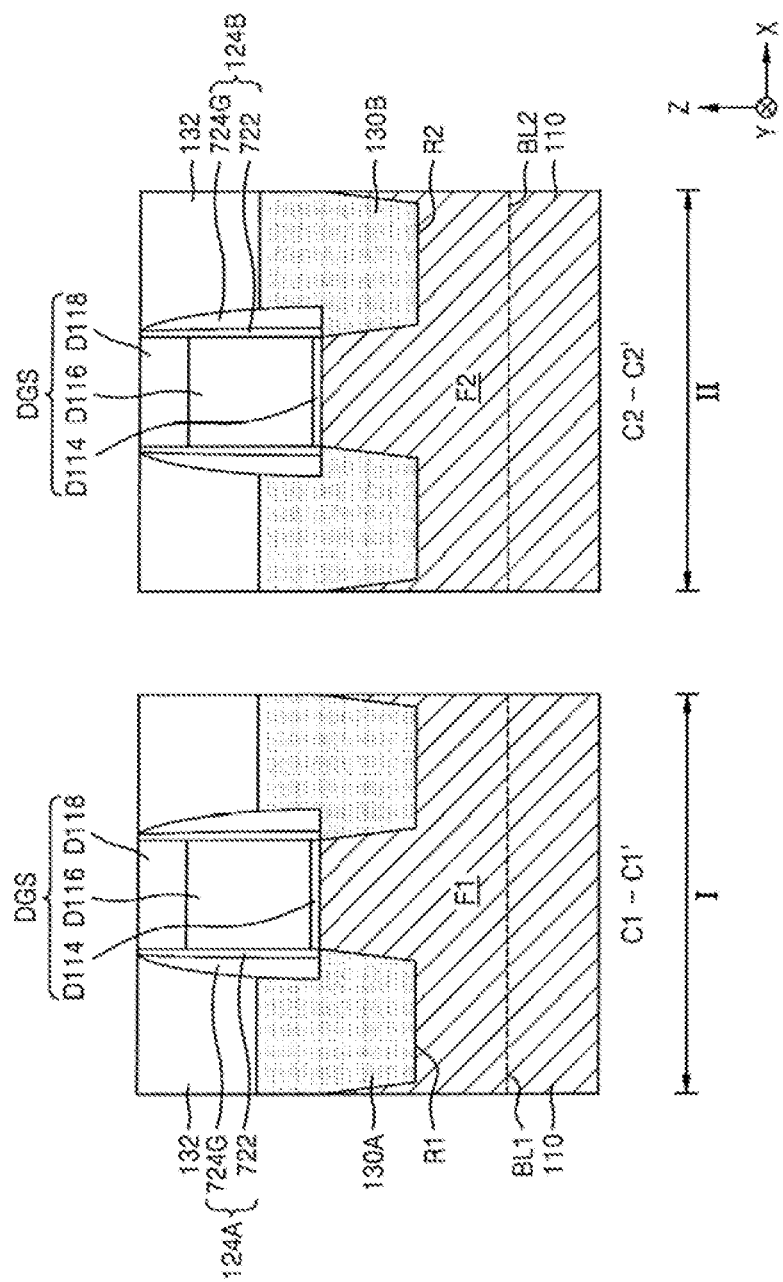

Referring to FIGS. 13A and 13B, in the first area I and the second area II, semiconductor layers are formed in the first and second recesses R1 and R2 on both sides of the dummy gate structures DGS by performing an epitaxial growth process on exposed surfaces of the first and second fin-type active regions F1 and F2, thereby forming first and second source/drain regions 130A and 130B. The epitaxial growth process may be a selective epitaxial growth process. In the selective epitaxial growth process, the substrate containing the first and second fin-type active regions F1 and F2 is placed in a reaction chamber, then a source gas is supplied into the reaction chamber. The source gas for depositing silicon may include, for example, $SiCl_4$, $SiF_4$, $SiH_2Cl_2$, $SiHCl_3$, $SiH_4$ or $Si_2H_6$. For depositing germanium, silicon germanium, or other semiconductor, other source gas may be used. The source gas for depositing silicon supplied inside the reaction chamber is absorbed on the surface of the exposed surfaces of the first and second fin-type active regions F1 and F2, and the silicon epitaxial layer is then selectively formed on the exposed surfaces of the first and second fin-type active regions F1 and F2. Since only a top surface (a bottom surface of the first recess R1) of the first fin-type active region F1 is exposed (see FIG. 12A, the first area I), the first source/drain region 130A may only be formed on the top surface of the first fin-type active region F1 with the fin insulating spacer 128 covering both sidewalls of the first fin-type active region F under the first recess R1 and between the first device isolation layer 112A and the first source/drain region 130A (see FIG. 13A, the first area I). Since a top surface (a bottom surface of the second recess R2) and both upper sidewalls of the second fin-type active region F2 are exposed (see FIG. 12A, the second area II), the second source/drain region 130B may be formed to cover the top surface and both upper sidewalls of the second fin-type active region F2 with the second device isolation layer 112B and the second source/drain region 130B covering both sidewalls of the second fin-type active region F2 without a fin insulating spacer therebetween (see FIG. 13A, the second area II).

Cross-section shapes of the first and second source/drain regions 130A and 130B shown in FIGS. 13A and 13B are merely examples and may be variously changed and modified without departing from the spirit and scope of the inventive concept. For example, the cross-sectional shapes of the first and second source/drain regions 130A and 130B, which are cut along a Y-Z plane, may be circular shapes, elliptical shapes, or polygonal shapes such as quadrangles, pentagons, and hexagons.

Each of the first and second source/drain regions 130A and 130B may include an impurity-doped semiconductor layer. In an exemplary embodiment of the inventive concept, each of the first and second source/drain regions 130A and 130B may include impurity-doped Si, SiGe, or SiC.

In the first area I and the second area II, an inter-gate dielectric 132 is formed and covers the first and second source/drain regions 130A and 130B, the dummy gate structures DGS, and the first and second gate insulating spacers 124A and 124B.

In an example of forming the inter-gate dielectric 132, an insulating layer may be formed to a sufficient thickness and covers the first and second source/drain regions 130A and 130B, the dummy gate structures DGS, and the first and second gate insulating spacers 124A and 124B. Next, the result product including the insulating layer may be planarized with a planarization process (e.g., chemical mechanical polishing (CMP)) such that the plurality of dummy gate structures DGS are exposed, thereby forming the inter-gate dielectric 132 having a planarized top surface.

Figure 14A:
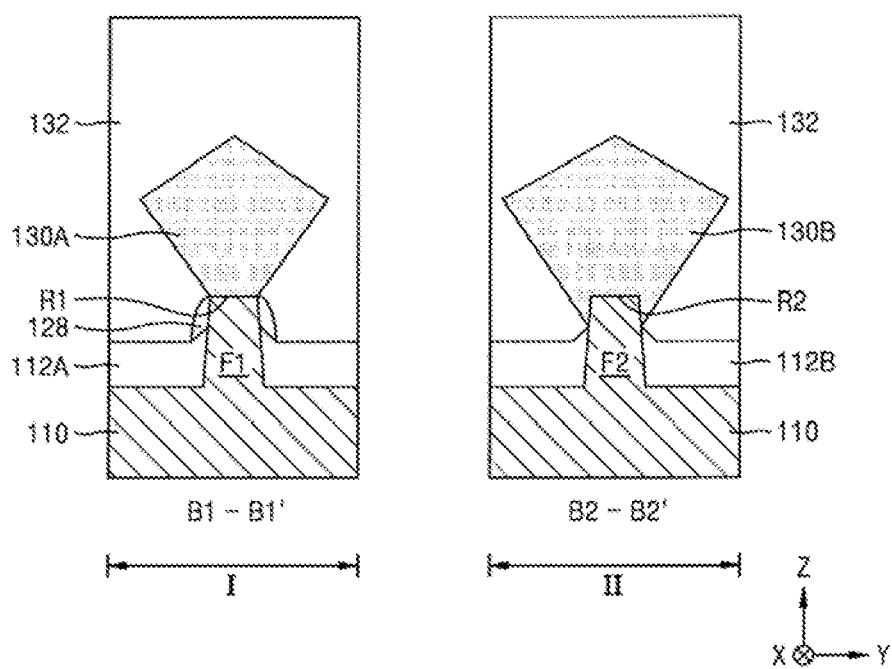
Figure 14B:
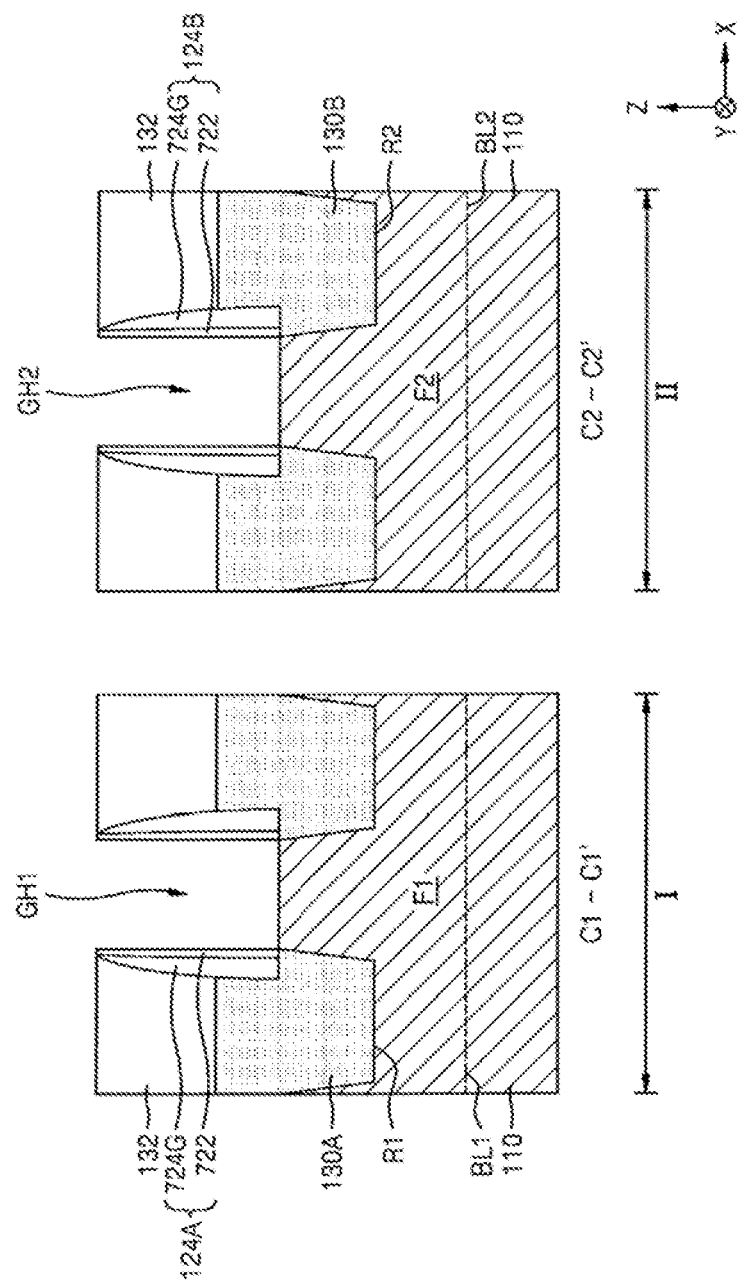

Referring to FIGS. 14A and 14B, in the first area I and the second area II, the plurality of dummy gate structures DGS exposed by the inter-gate dielectric 132 are removed, thereby forming a first gate space GH1 in the first area I and forming a second gate space GH2 in the second area II.

The first gate insulating spacer 124A and the first fin-type active region F1 may be exposed by the first gate space GH1, and the second gate insulating spacer 124B and the second fin-type active region F2 may be exposed by the second gate space GH2.

Figure 15A:
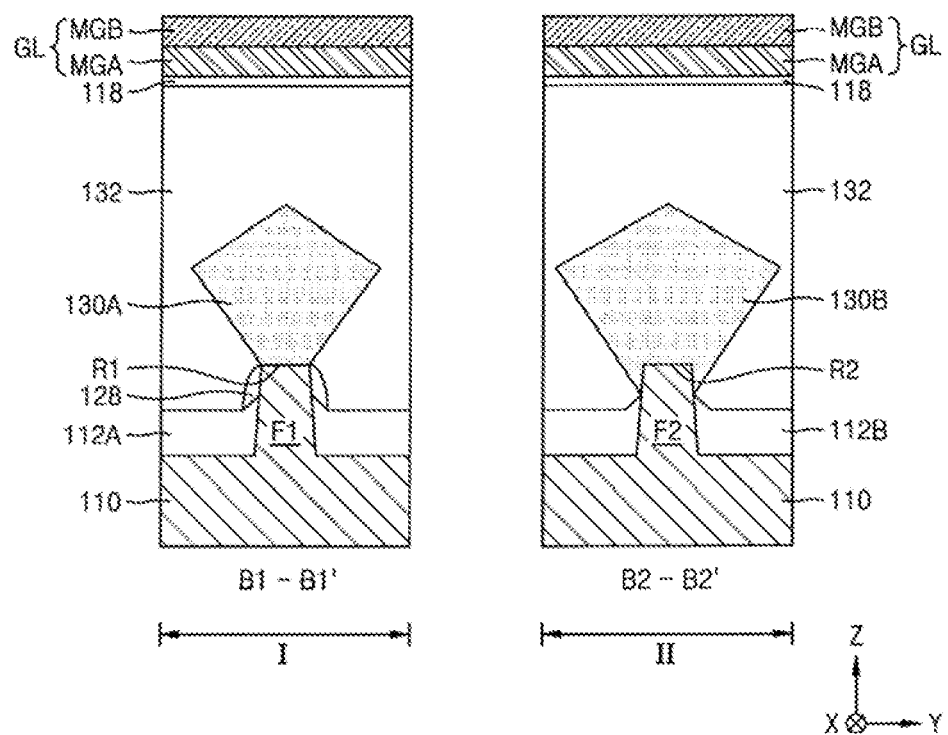
Figure 15B:
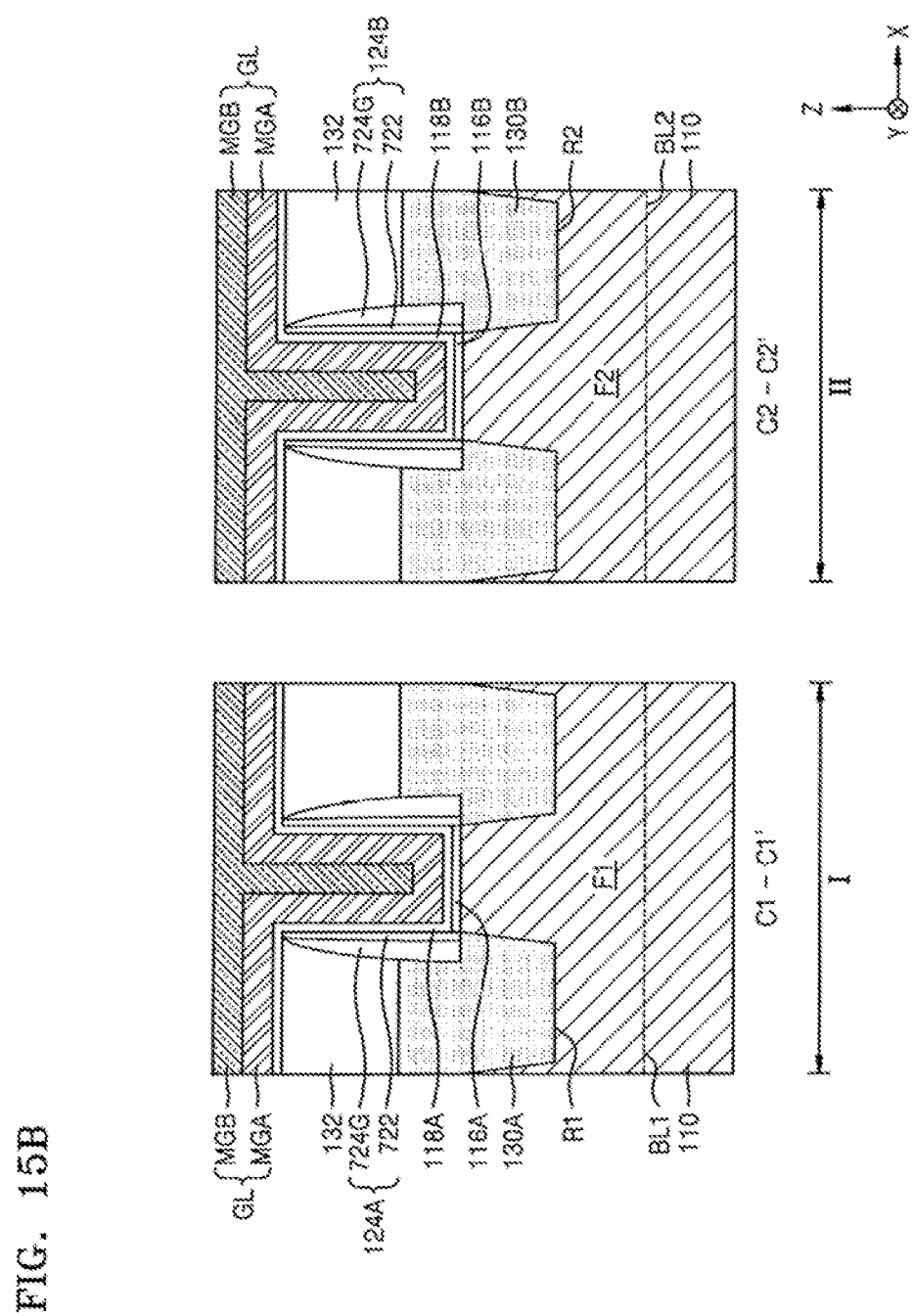

Referring to FIGS. 15A and 15B, in the first area I and the second area II, a first interfacial layer 116A, a first gate insulating layer 118A, and a gate line GL are formed in the first gate space GH1 (see FIG. 14B) in this stated order, and a second interfacial layer 116B, a second gate insulating layer 118B, and the gate line GL are formed in the second gate space GH2 (see FIG. 14B) in this stated order.

A process of forming the first and second interfacial layers 116A and 116B may include a process of oxidizing exposed portions of the first and second fin-type active regions F1 and F2 in the first and second gate spaces GH1 and GH2 (see FIG. 14B). In an exemplary embodiment of the inventive concept, the first and second interfacial layers 116A and 116B may include, for example, a silicon oxide layer, a silicon oxynitride layer, a silicate layer, or combinations thereof.

The first and second gate insulating layers 118A and 118B and the gate line GL may cover a top surface of the inter-gate dielectric 132 while filling insides of the first and second gate spaces GH1 and GH2 (see FIG. 14B). The first and second gate insulating layers 118A and 118B may be formed by an ALD, a CVD, or a PVD process.

The gate line GL may have a sufficient thickness to fill the first and second gate spaces GH1 and GH2. The gate line GL may include a first metal-containing layer MGA and a second metal-containing layer MGB. Details of the first metal-containing layer MGA and the second metal-containing layer MGB are as described with reference to FIGS. 2A to 2D. To form the gate line GL, an ALD, a CVD, or a PVD process may be used.

Figure 16A:
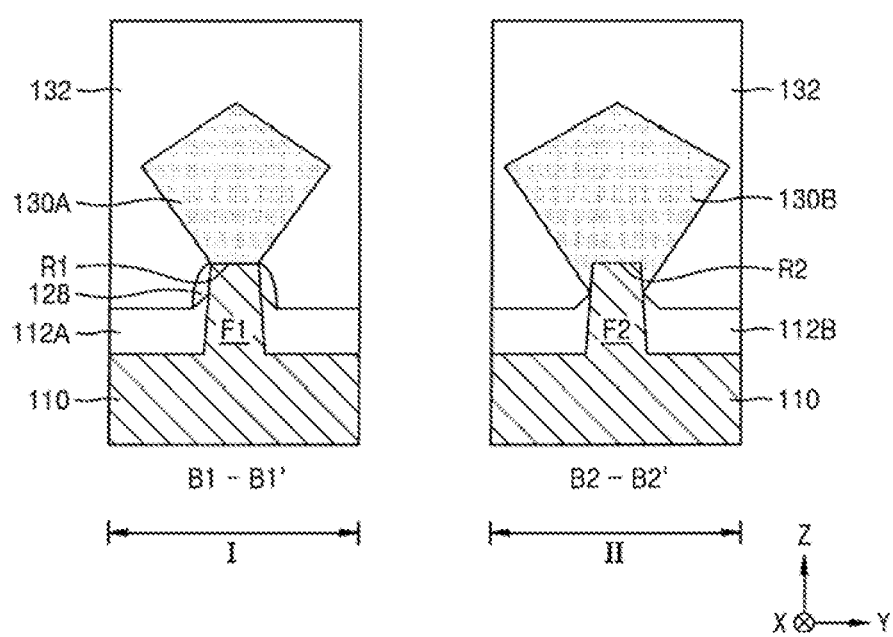
Figure 16B:
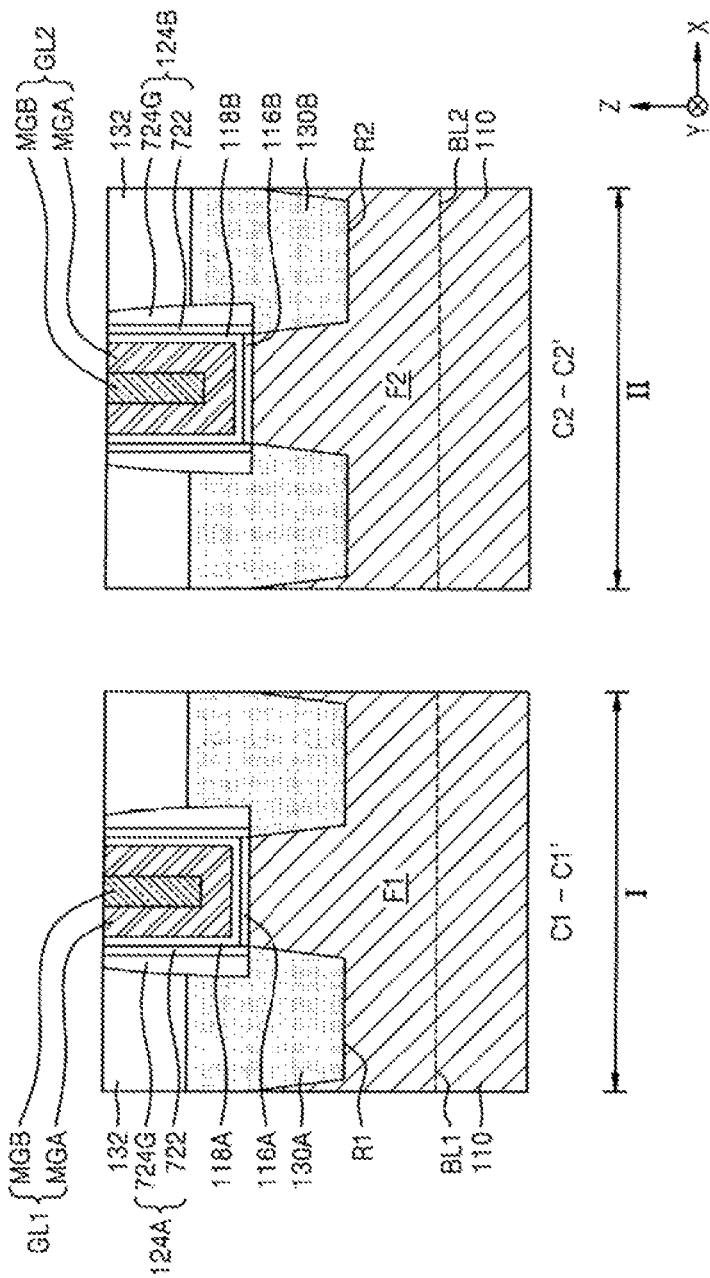

Referring to FIGS. 16A and 16B, unnecessary portions in the first area I and the second area II are removed from the result product of FIGS. 15A and 15B by a planarization process (e.g., a CMP process), whereby the gate line GL is separated into first and second gate lines GL1 and GL2, which respectively remain in the first and second gate spaces GH1 and GH2, and the first and second gate insulating layers 118A and 118B respectively remain only in the first and second gate spaces GH1 and GH2.

As a result of the planarization process, the first and second gate insulating spacers 124A and 124B and the inter-gate dielectric 132 are consumed from respective top surfaces thereof so as to reduce a certain thickness from each, that is, vertical thicknesses (Z-directional thicknesses) thereof may be reduced, and top surfaces of the first and second gate insulating layers 118A and 118B, the top surfaces of the first and second gate insulating spacers 124A and 124B, and the top surface of the inter-gate dielectric 132 may be exposed around top surfaces of the first and second gate lines GL1 and GL2.

Figure 17A:
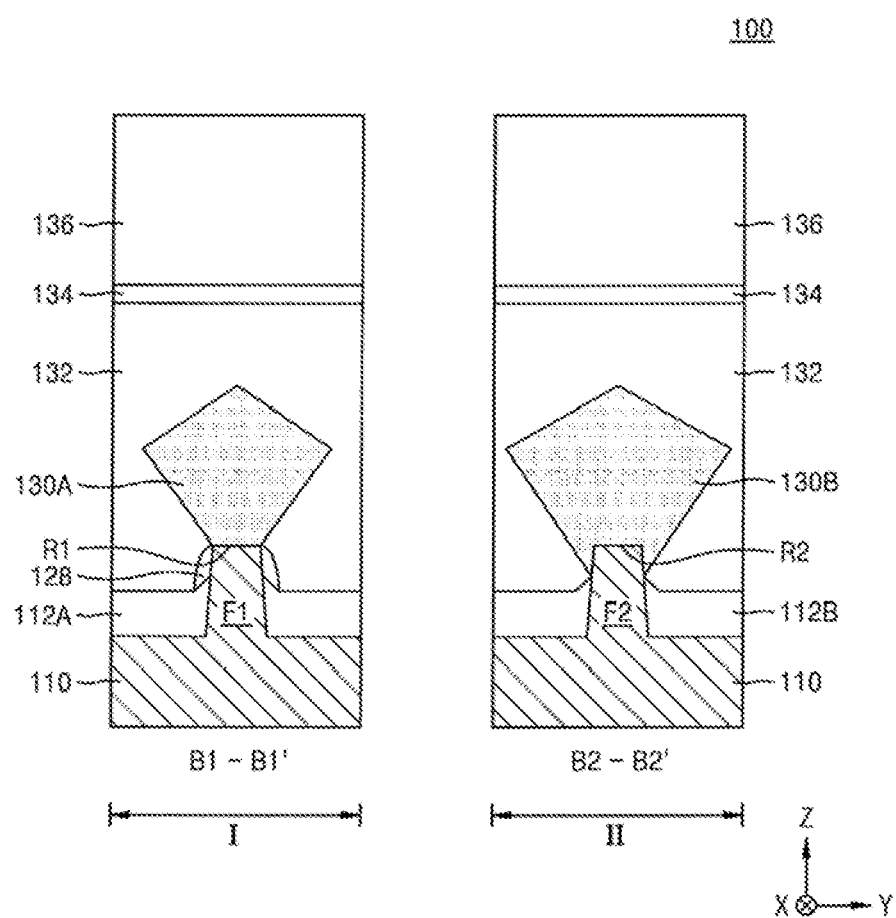
Figure 17B:
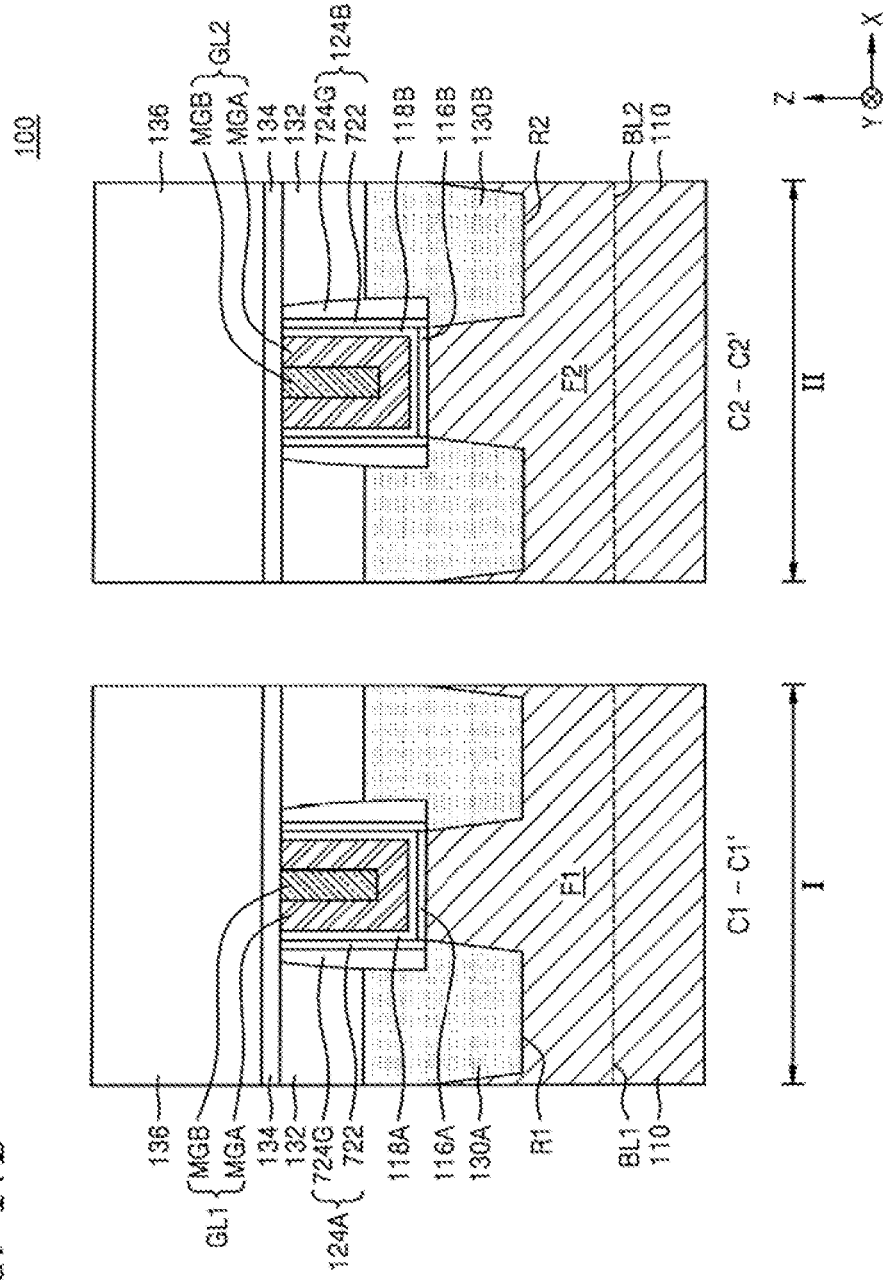

Referring to FIGS. 17A and 17B, in the first area I and the second area II, a blocking insulating layer 134 and an interlayer dielectric 136 are formed in this stated order and cover the top surfaces of the first and second gate lines GL and GL2, the top surfaces of the first and second gate insulating layers 118A and 118B, the top surfaces of the first and second gate insulating spacers 124A and 124B, and the top surface of the inter-gate dielectric 132.

The interlayer dielectric 136 may have a planarized top surface. Although the interlayer dielectric 136 is shown as having a flat layer shape, the interlayer dielectric 136 may have various shapes without departing from the spirit and scope of the inventive concept.

After forming the blocking insulating layer 134 and the interlayer dielectric 136, a mask pattern may be formed (e.g., through a lithographic process) on the interlayer dielectric 136, followed by etching the interlayer dielectric 136, the blocking insulating layer 134, and the inter-gate dielectric 132 in this stated order by using the mask pattern as an etch mask, thereby forming contact holes penetrating the interlayer dielectric 136, the blocking insulating layer 134, and the inter-gate dielectric 132, as needed. Next, a conductive material may fill the contact holes, thereby forming first and second source/drain contact plugs 140A and 140B shown by the dashed lines in FIG. 2B, the first and second source/drain contact plugs 140A and 140B being respectively electrically connected to the first and second source/drain regions 130A and 130B.

According to the method of fabricating the integrated circuit device 100, which includes the processes described with reference to FIGS. 9A to 17B, the integrated circuit device including unit devices may be fabricated by a low-cost simplified process, in which the unit devices may have different structures to secure different electrical properties that are required depending upon the kinds and structures of the unit devices. Therefore, the realization of the integrated circuit device providing optimum reliability and performance may be facilitated.

Heretofore, although the method of fabricating the integrated circuit device 100 shown in FIGS. 1 to 2D has been described with reference to FIGS. 9A to 17B, it will be understood by those skilled in the art that the integrated circuit device 200 shown in FIGS. 3A and 3B, the integrated circuit device 300 shown in FIGS. 4A and 4B, the integrated circuit device 400 shown in FIG. 5, or integrated circuit devices having various structures changed and modified therefrom may be fabricated by changes and modifications of the method described with reference to FIGS. 9A to 17B without departing from the spirit and scope of the inventive concept.

In an exemplary embodiment of the inventive concept, to fabricate the integrated circuit device 200 shown in FIGS. 3A and 3B, instead of respectively forming the first recess R1 and the second recess R2 in the first area I and the second area II in the process described with reference to FIGS. 12A and 12B, the first recess R21 and the second recess R22 having different depths may be respectively formed in the first area I and the second area II by controlling an etching amount of the first fin-type active region F1 and an etching amount of the second fin-type active region F2. Next, similar processes to the processes described with reference to FIGS. 13A to 17B are performed, thereby fabricating the integrated circuit device 200.

In an exemplary embodiment of the inventive concept, to fabricate the integrated circuit device 300 shown in FIGS. 4A and 4B, process conditions during the dry etching process and/or the wet cleaning process described with reference to FIGS. 12A and 12B are controlled, or the pre-treatment process set forth above is added and process conditions during the plasma application process and/or the ion implantation process as the pre-treatment process are controlled, whereby the sizes of the first fin insulating spacer 328A and the second fin insulating spacer 328B respectively remaining in the first area I and the second area II may be controlled.

In an exemplary embodiment of the inventive concept, to fabricate the integrated circuit device 400 shown in FIG. 5, instead of respectively forming the first recess R1 and the second recess R2 in the first area I and the second area II in the process described with reference to FIGS. 12A and 12B, the first recess R21 and the second recess R22 having different depths are respectively formed in the first area I and the second area II by controlling the etching amount of the first fin-type active region F and the etching amount of the second fin-type active region F2, followed by controlling the process conditions during the dry etching process and/or the wet cleaning process described with reference to FIGS. 12A and 12B or controlling the process conditions during the plasma application process and/or the ion implantation process as the pre-treatment process, whereby the sizes of the first fin insulating spacer 428A and the second fin insulating spacer 428B respectively remaining in the first area I and the second area II may be controlled.

Although the integrated circuit devices including FinFETs having 3-dimensional-structured channels and the fabrication methods thereof have been described with reference to FIGS. 1 to 17B, the inventive concept is not limited thereto. For example, it will be understood by those skilled in the art that integrated circuit devices including planar MOSFETs having the features according to the inventive concept and fabrication methods thereof may be provided by various modifications and changes of the inventive concept without departing from the spirit and scope of the inventive concept.

Figure 18:
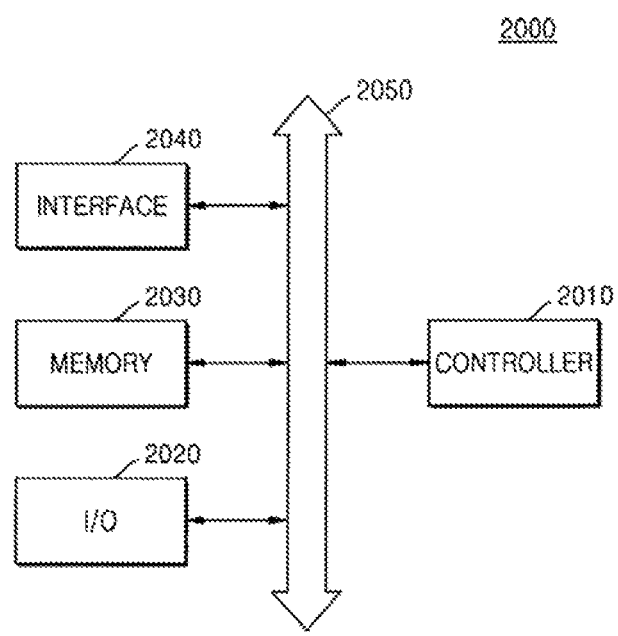
FIG. 18 is a block diagram of an electronic system including an integrated circuit device according to an exemplary embodiment of the inventive concept.

FIG. 18 is a block diagram of an electronic system 2000 including an integrated circuit device according to an exemplary embodiment of the inventive concept.

The electronic system 2000 includes a controller 2010, an input/output (I/O) device 2020, a memory 2030, and an interface 2040, and these components are connected to each other through a bus 2050.

The controller 2010 may include at least one of a microprocessor, a digital signal processor, and processors similar thereto. The input/output device 2020 may include at least one of a keypad, a keyboard, and a display. The memory 2030 may be used for storing a command executed by the controller 2010. For example, the memory 2030 may be used for storing user data.

The electronic system 2000 may constitute a wireless communication device, or a device capable of transmitting and/or receiving information in a wireless environment. In the electronic system 2000, to transmit/receive data through a wireless communication network, the interface 2040 may be configured as a wireless interface. The interface 2040 may include an antenna and/or a wireless transceiver. In an exemplary embodiment of the inventive concept, the electronic system 2000 may be used for a communication interface protocol of a 3rd-generation communication system, such as, for example, code division multiple access (CDMA), global system for mobile communications (GSM), north American digital cellular (NADC), extended-time division multiple access (E-TDMA), and/or wide band code division multiple access (WCDMA). The electronic system 2000 may include at least one of the integrated circuit devices 100, 200, 300, 400, and 500 shown in FIGS. 1 to 8 and integrated circuit devices having various structures changed and modified therefrom without departing from the spirit and scope of the inventive concept.

While the inventive concept has been particularly shown and described with reference to specific exemplary embodiments thereof, it will be understood that various changes in form and details may be made therein without departing from the spirit and scope of the following claims.

What is claimed is:

1. A method of fabricating an integrated circuit device, the method comprising:
    forming a first fin-type active region in a first region of a substrate and a second fin-type active region in a second region of the substrate;
    forming a spacer layer on the substrate, the spacer layer covering the first fin-type active region and the second fin-type active region; and
    etching the spacer layer, the first fin-type active region and the second fin-type active region to simultaneously form a first recess on the first fin-type active region, a second recess on the second fin-type active region, and a first fin insulating spacer, the first fin insulating spacer being a first residual portion of the spacer layer, which covers a sidewall of the first fin-type active region under the first recess.

2. The method of claim 1, wherein, in the etching, a sidewall of the second fin-type active region under the second recess is exposed during the formation of the first fin insulating spacer.

3. The method of claim 1, wherein, in the etching, a second fin insulating spacer is further formed during the formation of the first fin insulating spacer, the second fin insulating spacer covering a sidewall of the second fin-type active region under the second recess.

4. The method of claim 3, wherein a height of the second fin insulating spacer is smaller than a height of the first fin insulating spacer.

5. The method of claim 1, wherein a depth of the first recess is smaller than a depth of the second recess.

6. The method of claim 1, wherein the etching comprises dry etching and wet cleaning, the dry etching and the wet cleaning being performed in this stated order.

7. The method of claim 6, wherein the etching further comprises pre-treatment for damaging at least a portion of the spacer layer, after the dry etching, before the wet cleaning.

8. The method of claim 6, wherein the etching further comprises applying plasma to at least a portion of the spacer layer, after the dry etching, before the wet cleaning, the plasma being obtained from a gas comprising $CF_4$, $O_2$, He, HBr, $NF_3$, Ar, $Cl_2$, $N_2$, $CH_3F$, $CH_4$, or combinations thereof.

9. The method of claim 6, wherein the etching further comprises implanting ions into at least a portion of the spacer layer, after the dry etching, before the wet cleaning, the ions being obtained from a gas comprising Ge, $BF_2$, As, or combinations thereof.

10. The method of claim 1, wherein the spacer layer comprises SiOCN, SiCN, or combinations thereof.

11. A method of fabricating an integrated circuit device, the method comprising:
    forming a first fin-type active region and a first device isolation layer in a first area of a substrate and a second fin-type active region and a second device isolation layer in a second area of the substrate, the first device isolation layer covering both lower sidewalls of the first fin-type active region, and the second device isolation layer covering both lower sidewalls of the second fin-type active region;
    forming a first dummy gate structure on the first device isolation layer and a second dummy gate structure on the second device isolation layer, the first dummy gate structure covering the first fin-type active region, and the second dummy gate structure covering second fin-type active region;
    forming a spacer layer, the spacer layer covering the first fin-type active region, the second fin-type active region, the first dummy gate structure, and the second dummy gate structure; and
    etching the spacer layer, the first fin-type active region and the second fin-type active region to simultaneously form a first gate insulating spacer, a second gate insulating spacer, a first recess on the first fin-type active region, a second recess on the second fin-type active region, and a first fin insulating spacer, the first gate insulating spacer comprising a first portion of the spacer layer and covering both sidewalls of the first dummy gate structure, the second gate insulating spacer comprising a second portion of the spacer layer and covering both sidewalls of the second dummy gate structure, and the first fin insulating spacer comprising a third portion of the spacer layer and covering a sidewall of the first fin-type active region between the first device isolation layer and the first recess.

12. The method of claim 11, wherein, in the etching, a portion of the spacer layer covering a sidewall of the second fin-type active region is removed, whereby the sidewall of the second fin-type active region between the second device isolation layer and the second recess is exposed after the formation of the first fin insulating spacer.

13. The method of claim 11, wherein, in the etching, a second fin insulating spacer is further formed during the formation of the first fin insulating spacer, the second fin insulating spacer comprising a fourth portion of the spacer layer and covering a sidewall of the second fin-type active region between the second device isolation layer and the second recess.

14. The method of claim 13, wherein a height of the second fin insulating spacer is smaller than a height of the first fin insulating spacer.

15. The method of claim 11, wherein, in the etching, a depth of the first recess is smaller than a depth of the second recess.

16. The method of claim 11, wherein the etching comprises dry etching and wet cleaning, the dry etching and the wet cleaning being performed in this stated order, wherein the dry etching comprises:
    forming a preliminary gate insulating spacer by removing a portion of the spacer layer, the preliminary gate insulating spacer covering both sidewalls of each of the first and second dummy gate structures;

forming a first preliminary recess by removing a portion of the first fin-type active region;

forming a second preliminary recess by removing a portion of the second fin-type active region; and forming a preliminary fin insulating spacer, which is a residual portion of the spacer layer remaining on a sidewall of the first fin-type active region between the first device isolation layer and the first preliminary recess and a sidewall of the second fin-type active region between the second device isolation layer and the second preliminary recess, and the wet cleaning comprises:

removing a portion of the preliminary gate insulating spacer;

further removing a portion of the first fin-type active region via the first preliminary recess; and further removing a portion of the second fin-type active region via the second preliminary recess.

17. The method of claim 16, wherein the etching further comprises a pre-treatment for damaging at least a portion of the preliminary fin insulating spacer, after the dry etching, before the wet cleaning.

18. The method of claim 11, wherein the etching comprises dry etching and wet cleaning, the dry etching and the wet cleaning being performed in this stated order, the etching further comprises a pre-treatment, after the dry etching, before the wet cleaning, and the pre-treatment comprises modifying at least a portion of the spacer layer by using plasma, ion implantation, or combinations thereof.

19. The method of claim 18, wherein the pre-treatment comprises implanting ions into at least a portion of the spacer layer, the ions being obtained from a gas comprising Ge, $BF_2$, As, or combinations thereof.

20. The method of claim 11, wherein, in the etching, the first fin insulating spacer is integrally connected to the first gate insulating spacer.

* * * * *